(12) United States Patent
Seth et al.

(10) Patent No.: US 7,830,216 B1
(45) Date of Patent: Nov. 9, 2010

(54) PRECISION, TEMPERATURE STABLE CLOCK USING A FREQUENCY-CONTROL CIRCUIT AND A SINGLE OSCILLATOR

(75) Inventors: Manu Seth, San Jose, CA (US); David Brubaker, Los Altos, CA (US); Andrew McCraith, Orinda, CA (US); Richard Steven Miller, Los Altos, CA (US); Mir Bahram Ghaderi, Cupertino, CA (US)

(73) Assignee: Silicon Labs SC, Inc., Sunnyvale, CA (US)

( * ) Notice: Subject to any disclaimer, the term of this patent is extended or adjusted under 35 U.S.C. 154(b) by 11 days.

(21) Appl. No.: 12/236,454

(22) Filed: Sep. 23, 2008

(51) Int. Cl.
*H03K 3/00* (2006.01)
(52) U.S. Cl. .................. 331/177 R; 331/176; 331/74; 327/160; 327/291
(58) Field of Classification Search .......... 331/1 R, 331/44, 74, 177 R, 1 A, 18, 176; 327/160, 327/291, 115, 116, 117, 119
See application file for complete search history.

(56) References Cited

U.S. PATENT DOCUMENTS

| | | | |
|---|---|---|---|
| 4,344,036 A | 8/1982 | Dakroub et al. | |
| 5,604,468 A * | 2/1997 | Gillig | 331/176 |
| 5,781,073 A * | 7/1998 | Mii | 331/44 |
| 6,160,458 A | 12/2000 | Cole et al. | |
| 6,167,097 A | 12/2000 | Marston et al. | |
| 6,995,622 B2 * | 2/2006 | Partridge et al. | 331/66 |
| 7,154,305 B2 * | 12/2006 | Driediger et al. | 327/47 |
| 7,391,273 B2 * | 6/2008 | Seki et al. | 331/47 |
| 7,633,360 B2 * | 12/2009 | Weigold | 333/186 |
| 2002/0021054 A1 * | 2/2002 | Nguyen | 310/309 |
| 2005/0237125 A1 * | 10/2005 | Hino | 331/179 |

* cited by examiner

*Primary Examiner*—Robert Pascal
*Assistant Examiner*—Ryan Johnson
(74) *Attorney, Agent, or Firm*—O'Keefe, Egan, Peterman & Enders LLP

(57) ABSTRACT

A frequency-control circuit, which is configured to receive a first signal having a first untuned frequency from a first oscillator, and to alter one or more pulses of the first signal to tune an output frequency of an output clock signal to have an average frequency at the desired target frequency. In some embodiments, the frequency-control circuit receives a signal from a single oscillator to generate a calibrated, precise, and temperature-stable clock.

34 Claims, 15 Drawing Sheets

PRECISION, TEMPERATURE STABLE CLOCK USING A FREQUENCY-CONTROL CIRCUIT AND A SINGLE OSCILLATOR

RELATED APPLICATIONS

This application is related to the following co-pending U.S. Application: application Ser. No. 12/236,456, entitled "PRECISION, TEMPERATURE STABLE CLOCK USING A FREQUENCY-CONTROL CIRCUIT AND DUAL OSCILLATORS," filed Sep. 23, 2008.

TECHNICAL FIELD

Embodiments of the invention relate to the field of precision timing; and more specifically, to precision, temperature stable clocks.

BACKGROUND

A resonator is a device or system that exhibits resonance or resonant behavior, that is, it naturally oscillates at some frequencies, called its resonance frequencies, with greater amplitude than at others. Resonators can be, for example, crystal oscillators (also known as quartz oscillators), inductance-capacitive (LC) oscillators, resistance-capacitive (RC) oscillators, and Microelectromechanical systems (MEMS) oscillators, also referred to as micromechanical MEMS oscillators. Resonators are generally passive devices that are combined with active circuitry to create an oscillator. The oscillator produces a signal at the resonant frequency. A crystal oscillator, for example, is an electronic circuit that uses the mechanical resonance of a vibrating crystal of piezoelectric material to create an electrical signal with a very precise frequency. Crystal oscillators, such as quartz oscillators, are commonly used to generate frequencies to keep track of time (as in quartz clocks) or to generate a clock signal for digital integrated circuits. Usually, a different crystal is required for each desired frequency. Also, the crystal and the oscillator circuit compliments are typically distinct from one another, i.e., they are not integrated.

For the past several years, MEMS structures have been playing an increasingly important role in consumer products. For example, MEMS devices may be used in place of crystal oscillators to keep track of time and to generate a stable clock signal for digital integrated circuits. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictate that the processes used to fabricate such MEMS devices need to be extremely sophisticated.

In certain applications, the temperature stability and initial accuracy of resonators is particularly important, especially MEMS resonators. Uncompensated MEMS resonators have a temperature coefficient that can be approximately forty parts per million per degrees Celsius (i.e., 40 ppm/° C.), whereas quartz oscillators can be approximately 0.035 ppm/° C. without any special compensation. For example, in the context of sleep clock applications, which use resonators with inherent accuracy of +/−20 ppm, quartz oscillators have tighter initial accuracy, smaller temperature drift, and can be fine tuned with capacitive pulling in the oscillator circuit, as compared to uncompensated MEMS oscillators. Some conventional approaches have been used in quartz oscillators to improve initial accuracy and temperature stability. One such conventional approach uses a varactor to pull a sleep clock resonant frequency to improve temperature stability, such as described in U.S. Pat. No. 6,160,458. Another conventional approach uses pulse skipping and pulse addition to adjust the clock frequency in a receiver in order to synchronize the clock with a received signal, such as described in U.S. Pat. No. 6,167,097. Another conventional approach uses pulse skipping to create multiple clock frequencies, as described in U.S. Pat. No. 4,344,036. None of these approaches is used in the context of MEMS oscillators. Also, since uncompensated quartz oscillators have a lower temperature coefficient than MEMS oscillators, these conventional approaches are not used in a wide range of temperatures for temperature compensations of the oscillator.

Furthermore, traditional electrostatic pulling is not effective in high-frequency MEMS oscillators. High-frequency MEMS resonators, such as MEMS resonators having approximately 1 MHz frequency or greater, for example, have a very high equivalent stiffness that causes them to have a very small electrostatic frequency pulling range. In MEMS oscillators, capacitive pulling, like used in quartz-based oscillators, may also not be effective to adjust the output frequency for both initial accuracy and temperature stability due to extremely small effective capacitance of the MEMS resonators. For these reasons, new methods must be used to adjust the output frequency for both initial accuracy and temperature compensation over a wide range of temperatures for all types of resonators, such as quartz-based and MEMS oscillators.

BRIEF DESCRIPTION OF THE DRAWINGS

The invention may best be understood by referring to the following description and accompanying drawings that are used to illustrate embodiments of the invention. In the drawings.

DETAILED DESCRIPTION

Figure 1:
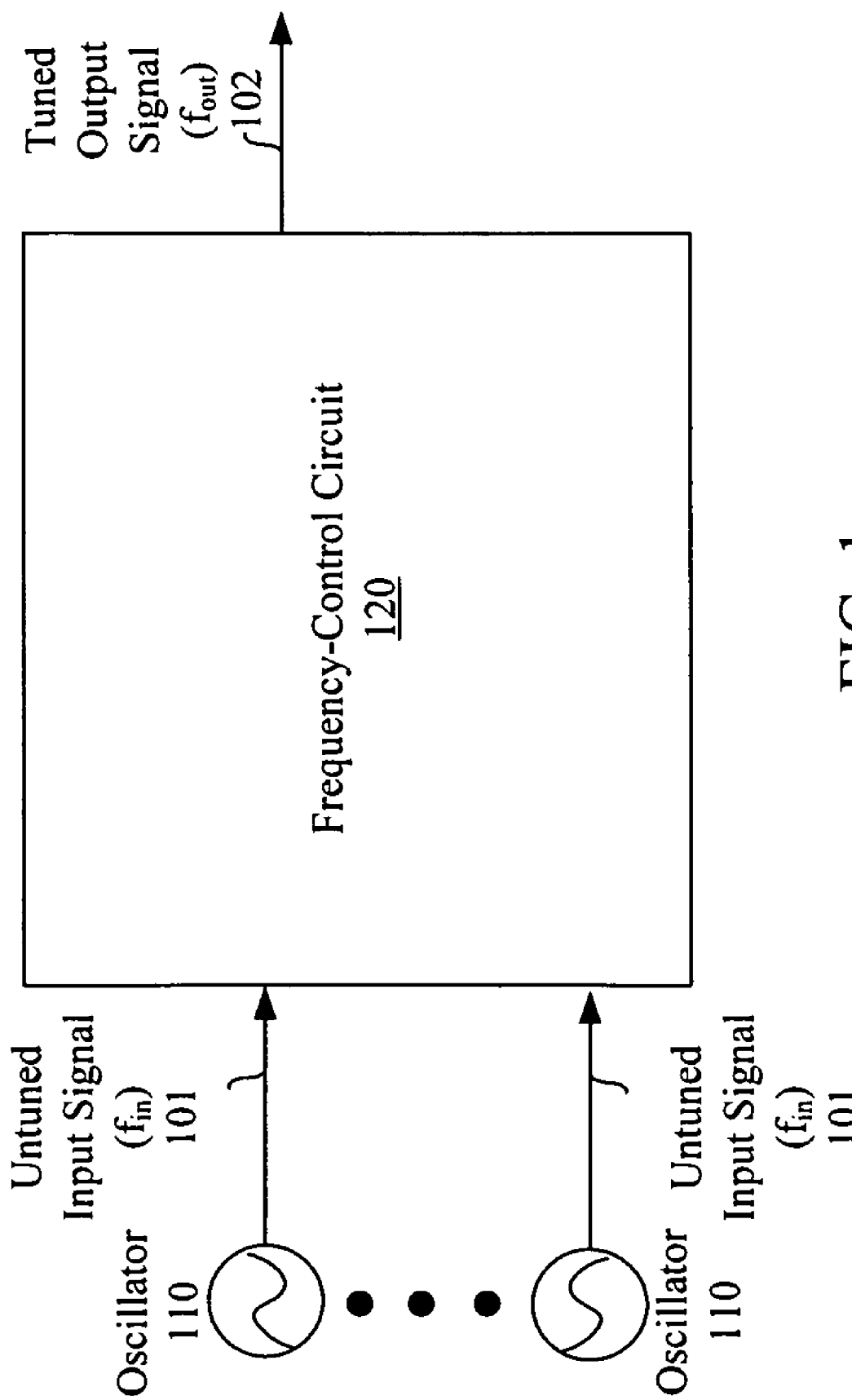
FIG. 1 is a block diagram of one embodiment of a frequency-control circuit.

A frequency-control circuit is described. In the following description, for purposes of explanation, numerous specific details are set forth, such as material compositions and chemical regimes, in order to provide a thorough understanding of the invention. It should be apparent to one skilled in the art that the present invention may be practiced without these specific instances. In other instances, well-known features, such as circuits, structures, and techniques, are not described in detail in order to not unnecessarily obscure the present invention. Furthermore, it should be understood that various embodiments shown in the Figures are illustrative representations and are not necessarily drawn to scale.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Disclosed herein is a frequency-control circuit which is configured to receive a first signal having a first untuned frequency from a first oscillator, and to alter one or more pulses of the first signal to tune an output frequency of an output clock signal to have an average frequency at the desired target frequency. Altering pulses may be done using different techniques as described herein. For example, the pulses may be altered by removing pulses, adding pulses, removing and adding pulses, or the like; alternatively, altering pulses may also be done by switching between two oscillators at different frequencies. In one embodiment, the frequency-control circuit includes a counter to count a number of pulses of the first signal and a pulse-altering circuit to alter the one or more pulses of the first signal to tune the output frequency based on the number of pulses received from the counter. In another embodiment, the frequency-control circuit is configured to receive both the first signal having the first untuned frequency and a second signal having a second untuned frequency from a second oscillator, and to alter one or more pulses of the first and second signals to tune the output frequency of the output clock signal to have the average frequency at the desired target frequency.

In other embodiments, the frequency-control circuit receives a signal from a single oscillator to generate a calibrated, precise, and temperature-stable clock. In one embodiment, a single oscillator, a pulse counter, a pulse-altering circuit, and a control circuit work to produce a very accurate clock. The control circuit can be used to generate a static, calibrated frequency, or can be combined with a temperature sensor to also compensate for temperature sensitivity in the single oscillator. The pulse altering technique is used to tune the average output frequency of the clock. This frequency-control circuit allows a resonator with average initial accuracy to generate a clock source that can be tuned to an extremely high level of precision. The tuning can be further utilized to tune out temperature effects. Also, the pulse count at which pulses are altered can be dithered to reduce spurious signals in the output signal and improve the tuning resolution in the output signal. These particular embodiments use a single oscillator (e.g., MEMS, LC, RC, or quartz), a pulse-altering circuit, memory or registers to store calibration, and a control circuit to alter appropriate pulses and tune the average output frequency. The tuning can be coupled with a temperature sensor to dynamically stabilize frequency with respect to temperature. This may be done with a stored temperature profile and corresponding circuitry to dynamically stabilize the frequency with respect to temperature based on the measured temperature by the temperature sensor. In one embodiment, a frequency-control circuit uses pulse altering of a single frequency to create a calibrated and dynamically tunable output frequency. The frequency-control circuit can be adjusted for initial frequency and/or for temperature compensation via pulse altering.

In some embodiments, two oscillators of intentionally different frequencies are periodically switched at a duty factor, which is dependent on an absolute temperature and initial calibration, to generate a calibrated, precise, and temperature-stable clock. In one embodiment, a frequency-control circuit uses two oscillators and creates an output frequency set by switching between the two at a fixed or variable duty factor. The frequency-control circuit can be adjusted for initial frequency and/or for temperature compensation via the duty factor control. A possible advantage of these embodiments is that the two resonators of average temperature stability and initial accuracy can be used to generate a very stable clock source that only requires temperature calibration and a control circuit to adjust the duty factor of the oscillator switch, which switches between the two oscillators. These particular embodiments use multiple oscillators (e.g., MEMS, LC, RC, or quartz oscillators) and a variable duty factor switch circuit to provide simple calibration and a temperature stable frequency source. The variable duty factor switch circuit can be dithered to reduce spurious signals, as described herein.

The embodiments described herein are useful for various types of resonators, such as MEMS, LC, and RC resonators, to improve initial accuracy and temperature stability. Although various embodiments described herein are described with respect to MEMS oscillators, these embodiments may be used to improve the performance of quartz oscillators. The embodiments described herein are especially applicable for sleep clock application where instantaneous frequency accuracy is not required, such as data transport. For example, the frequency-control circuit may be used for applications, such as watches, countdown timers, and other clock applications that do not require an accurate instantaneous frequency. In sleep clock applications, the instantaneous frequency could be off approximately between 100 and 1000 ppm without affecting the clock application. Using the embodiments described herein, the average frequency could be as accurate as approximately 1 ppm or better. It should be noted that the embodiments described herein may be used for both initial frequency shifts and temperature-compensated shifts, as well as only for initial frequency shifts. In those embodiments, mechanical temperature compensation may be used to compensate for temperatures, instead of electrical temperature compensation. In one embodiment, the frequency-control circuit is used as part of an averaging scheme to tune a clock circuit to generate an output clock signal having an average frequency over time at the desired target frequency of the clock circuit.

The embodiments described herein may provide one or more advantages over the conventional approaches. In particular, the embodiments described herein may be used to allow the use of smaller, lower-costing resonators (e.g., MEMS, LC, or RC) without sacrificing accuracy and temperature stability, as compared to the size, cost, and performance of quartz-based resonators. The embodiments described herein may also be used to improve the performance of quartz-based resonators. Also, the embodiments of pulse altering using a MEMS oscillator can enable lower power, accurate clocks, as compared to conventional approaches.

FIG. 1 is a block diagram of one embodiment of a frequency-control circuit 120. The frequency-control circuit 120 is coupled to one or more oscillators 110 to receive one or more input signals 101 having untuned input frequencies ($f_{in}$). The frequency-control circuit 120 uses the one or more untuned input signals 101 to generate a tuned output signal having a tuned frequency 102 ($f_{out}$). The tuned output signal 102 can be used for a clock signal. In one embodiment, the frequency-control circuit 120 can adjust the output frequency of the output signal 102 (e.g., clock output frequency) by altering certain pulses to shift the average frequency over time to be at the desired target frequency. Averaged over enough cycles, the adjusted frequency can be very accurate. Altering pulses may be done using different techniques as described herein. For example, the pulses may be altered by removing pulses, adding pulses, removing and adding pulses, or the like; alternatively, altering pulses may also be done by switching between two oscillators at different frequencies.

In one embodiment, the frequency-control circuit 120 can alter the pulses to shift the average frequency over time by removing one or more pulses of the input signal to shift the output signal to have an output frequency that has an accurate average frequency over time at the desired target frequency. In another embodiment, the frequency-control circuit 120 can alter the pulses to shift the average frequency over time by adding one or more pulses to the input signal to shift the output signal to have an output frequency that has an accurate average frequency over time at the desired target frequency. In another embodiment, the frequency-control circuit 120 can alter the pulses to shift the average frequency over time by removing one or more pulses of the input signal and adding one or more pulses to the input signal to shift the output signal to have an output frequency that has an accurate average frequency over time at the desired target frequency.

In another embodiment, the frequency-control circuit 120 can alter the pulses to shift the average frequency over time by switching between two oscillator frequencies (e.g., a frequency higher than the desired frequency and a frequency lower than the desired frequency) to shift the output signal to have an output frequency that has an accurate average frequency over time at the desired target frequency. As described above, the tuned output signal 102 may be used in sleep clock applications where instantaneous frequency accuracy is not required. The frequency-control circuit 120 may be used to adjust an initial frequency of the clock signal, and/or to adjust the frequency of the output signal 102 to compensate for changes in temperature.

As described below, in one embodiment, the frequency-control circuit 120 alters one or more pulses of one untuned input signal 101 to generate an output clock signal (e.g., tuned output signal 102) to have an average frequency over time at the desired target frequency. The frequency-control circuit 120 may remove, add, or remove and add one or more pulses to create a calibrated and dynamically tunable output frequency. The frequency-control circuit 120 may be used to produce a static, calibrated frequency, or can be combined with a temperature sensor to also compensate for temperature sensitivity in the oscillator. The pulse altering technique is used to tune the average output frequency of the clock signal (e.g., output signal 102). A possible advantage of this embodiment over other conventional tuning approaches is that a resonator with average initial accuracy may generate a frequency source that can be tuned to an extremely high level of precision and to tune out temperature effects on the resonator. The pulse-removal technique may also be dithered to reduce discrete switching spurious signals in the output signal 102.

In another embodiment, the frequency-control circuit 120 alters one or more pulses of two untuned input signals 101 to generate an output clock signal (e.g., tuned output signal 102) to have an average frequency over time at the desired target frequency. The frequency-control circuit 120 may switch between the two untuned input signals 101 of intentionally different frequencies at a duty factor (e.g., fixed or variable) dependent upon the absolute temperature to generate a calibrated, temperature stable clock signal (e.g., output signal 102). A possible advantage of this embodiment over other conventional tuning approaches is that two resonators of average temperature stability an initial accuracy can be used to generate a very stable source that only requires temperature calibration and the control circuit to adjust the duty factor of the oscillator selection switch, as described below. The duty factor switch circuit may provide a simple calibration and compensation for a temperature stable frequency source. The duty factor may also be dithered to reduce discrete switching spurious signals in the output signal 102.

The average frequency of the output signal 102 may be very precise and insulated from the effects of temperature. That is, the tuned output signal 102 may be a precise, temperature stable clock signal for various applications that do not require instantaneous frequency accuracy, such as data transport. The frequency-control circuit 120 may allow the use of smaller, lower cost resonators, such as MEMS, LC, or RC resonators without sacrificing accuracy and temperature stability. That is, the performance of the MEMS, LC, or RC resonators may be similar or better than quartz-based resonators. The frequency-control circuit 120 may also be used to improve the performance of quartz-based resonators.

Figure 2:
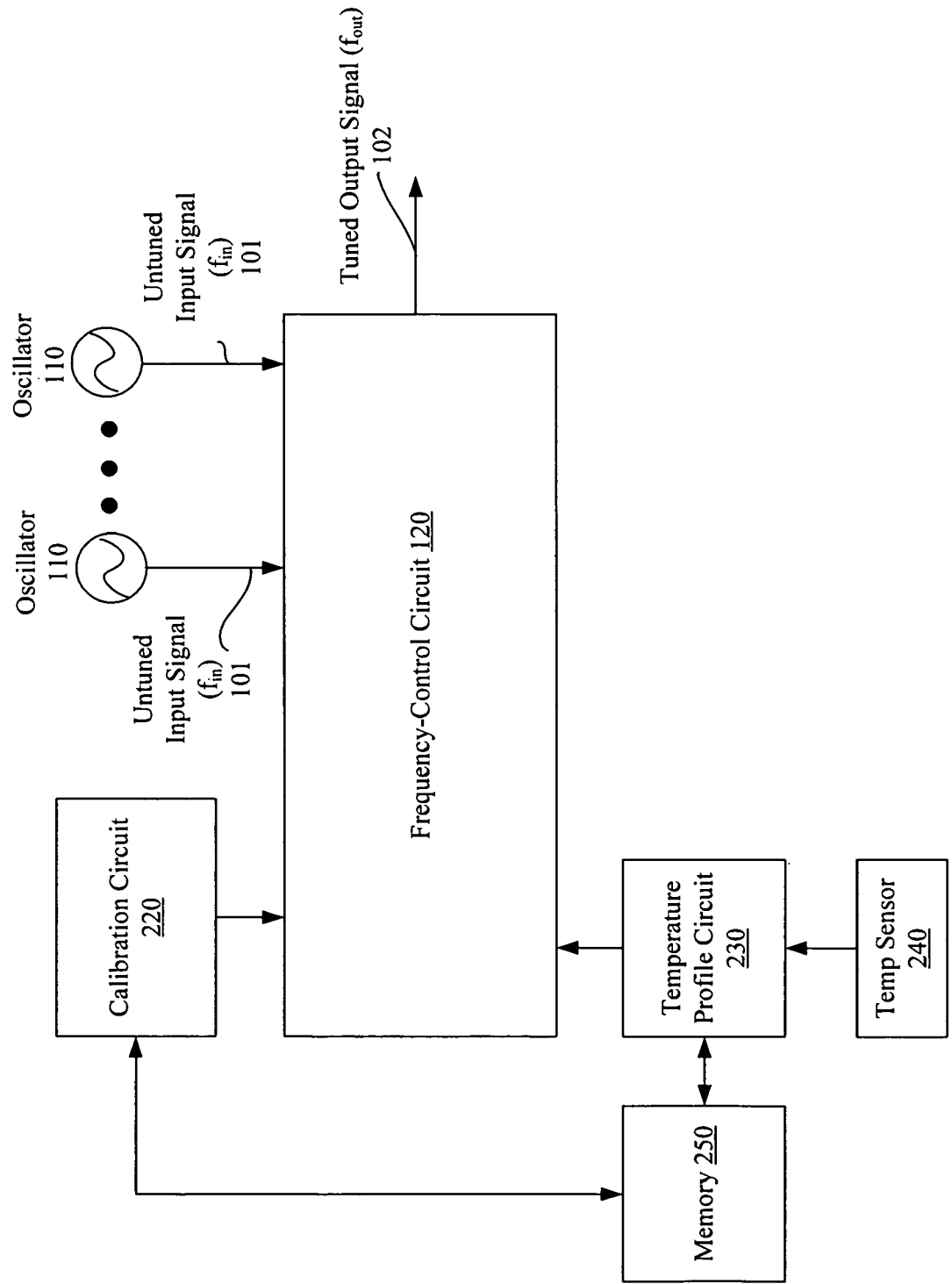
FIG. 2 is a block diagram of one embodiment of the frequency-control circuit coupled to a calibration circuit, a temperature profile circuit, and a temperature sensor.

FIG. 2 is a block diagram of one embodiment of the frequency-control circuit coupled to a calibration circuit 220, a temperature profile circuit 230, and a temperature sensor 240. The calibration circuit 220 is configured to calibrate the frequency-control circuit 120 to be tuned to an initial frequency value. In one embodiment, the initial frequency value is between approximately 35 kHz and 100 MHz. The initial frequency value may be represented as a count value to be sent to the frequency-control circuit 120. The count value may represent the amount of initial shift in frequency required to tune the untuned input frequency to the desired output frequency. The calibration circuit 220 may store the initial frequency values in memory 250. Alternatively, the initial frequency values may be stored in one or more registers. The initial frequency values may be pre-defined (e.g., hard-coded values), or alternatively, may be programmed by the user (e.g., programmable values). The calibration circuit 220 is used to initially calibrate the frequency-control circuit 120 to output an initial frequency for the clock signal (e.g., tuned output signal 102).

The temperature profile circuit 230 is configured to receive a temperature measured by the temperature sensor 240 and to compare the measured temperature to a temperature profile which is stored in the memory 250. The temperature profile indicates, for example, the amount of change in frequency per degree changes in temperature. The temperature profile may be specific to the types of oscillators that are being used. Typically, the temperature profile is representative of a graph of the resonance frequency of the oscillator over a range of temperatures. The temperature profile is indicative of the temperature characteristics (e.g., temperature coefficient) of the oscillator. For example, the temperature profile circuit 230 determines the shift required (e.g., 40 ppm for each degree change) given the currently measured temperature by the temperature sensor 240 (referred to herein as the temperature-compensated shift). Once the temperature profile circuit 230 has determined the temperature-compensated shift, the temperature profile circuit 230 sends the temperature-compensated shift to the frequency-control circuit 120 to tune the output signal 102 accordingly. Using the calibration circuit 220, temperature profile circuit 230, temperature sensor 240, and memory 250, the frequency-control circuit 120 may be tuned the output signal 102 to an initial frequency, as well as tune the output signal 102 to compensate for changes in temperature of the circuit.

Although the depicted embodiment illustrates the calibration circuit 220 and the temperature profile circuit 230 as separate circuits, in other embodiments, the calibration circuit 220 and the temperature profile circuit 230 may be a single circuit that sends the total required shift, which includes both the initial frequency shift and the temperature-compensated shift, to the frequency-control circuit 120.

Figure 3:
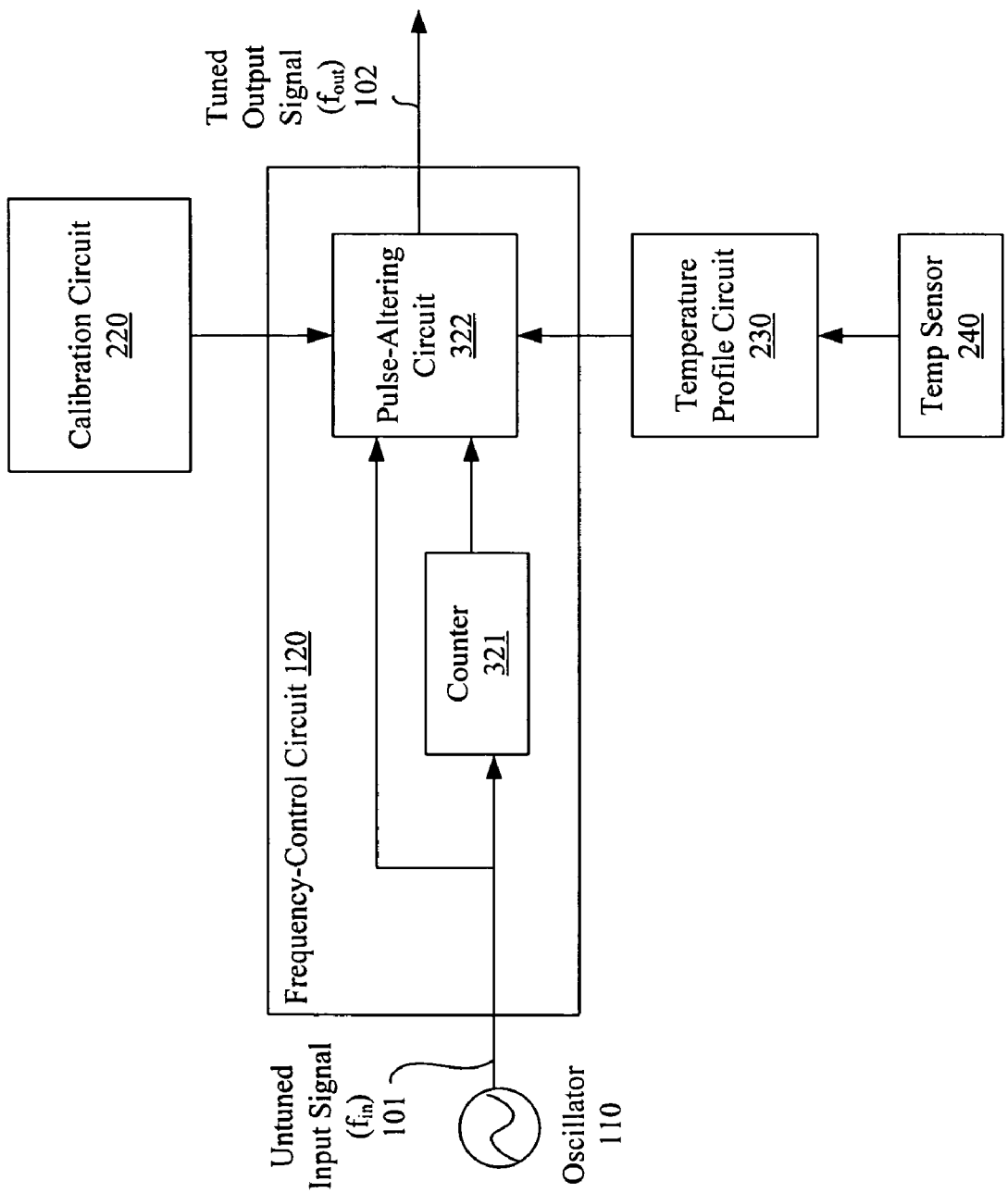
FIG. 3 is a block diagram of one embodiment of the frequency-control circuit having a pulse-altering circuit and a counter to alter one or more pulses of a single untuned input signal to generate a tuned output signal.

FIG. 3 is a block diagram of one embodiment of the frequency-control circuit 120 having a pulse-altering circuit 322 and a counter 321 to alter one or more pulses of a single untuned input signal 101 to generate a tuned output signal 102. The pulse-altering circuit 322 of the frequency-control circuit 120 can adjust the output frequency of the output signal 102 (e.g., clock output frequency) by altering certain pulses to shift the average frequency over time at the desired target frequency. Averaged over enough cycles, the adjusted frequency can be very accurate. The counter 321 is coupled to receive the untuned input signal 101 from the single oscillator 110, and to count the number of pulses of the input signal 101. The counter 321 outputs the count to the pulse-altering circuit 322. The pulse-altering circuit 322 also receives the untuned input signal 101 from the single oscillator 110. The pulse-altering circuit 322 receives the initial shift from the calibration circuit 220, as well as the temperature-compensated shift, if any, from the temperature profile circuit 230 to compensate for the effects of temperature. The pulse-altering circuit 322 alters one or more pulses of the input signal 101 to generate the tuned output signal 102 at the desired frequency. By altering one or more pulses of the input signal 101, the pulse-altering circuit 322 generates an average frequency for the output signal 102. The pulse-altering circuit 322 determines the number of the pulses to be altered, and the time of when those pulses should be altered (e.g., one or more pulses removed, or one or more pulses added), based on the input received from the temperature profile circuit 230, the calibration circuit 220, and the counter 321. For example, the pulse-altering circuit 322 determines the number of pulses that need to be removed over a period of time, and the timing of when those pulses are actually removed. As described previously, the pulse altering circuit 322 may dither when the pulses are removed or added to remove or reduce spurious signals in the output signal 102 and improve the tuning resolution of the output signal 102. In one embodiment, the pulse-altering circuit 322 compares the number of counts, counted by the counter 321, against a threshold value. Once the number of counts is equal to or greater than the threshold value, the pulse-altering circuit 322 blocks the next pulse from being generated on the output signal 102. Alternatively, other techniques may be used to remove from or add one or more pulses to the output signal.

Pulse altering may be used to tune the output signal 102 to be an accurate clock signal over a period of time. As noted above, these embodiments may be used in sleep clock applications or in other applications where instantaneous clock accuracy is not required. It should be noted that although these embodiments should not be used in applications where instantaneous clock accuracy is a factor, the embodiments described herein can generate a low cost, precise, temperature-stable clock signal having an accurate average frequency over a period of time for various applications. The minimum averaging time to get an accurate frequency may be represented by the following equation (1):

$$T_{ave} = \frac{N}{f_{in}}, \quad (1)$$

where N represents the count of pulses, and $f_{in}$ represents the input frequency of the input signal 101. For example, in one embodiment, when shifting by 0.5 ppm, approximately one minute of counting is done to obtain an accurate clock signal for 32 kHz input frequency. It should be noted that other input frequencies may be used and would take different times for counting. It should also be noted that other values for the amount of shift may be used. In one embodiment, the accuracy may range between approximately 0.1 ppm and 25 ppm over the temperature range. It should be noted that the temperature sensor's accuracy may be the limiting factor in this case. It should be noted that since it is easier to remove pulses than add pulses, the single oscillator 110 can be set to be a frequency ($f_{in}$) which is greater than the expected output frequency ($f_{out}$) (e.g., desired target frequency). For example, the oscillator 110 may be set at a frequency which is always greater than the expected output frequency over an entire temperature range. The pulse-altering circuit 322 receives the higher frequency and can remove pulses to tune the output frequency of the output signal 102 down to the expected output frequency (e.g., desired target frequency).

Figure 4A:
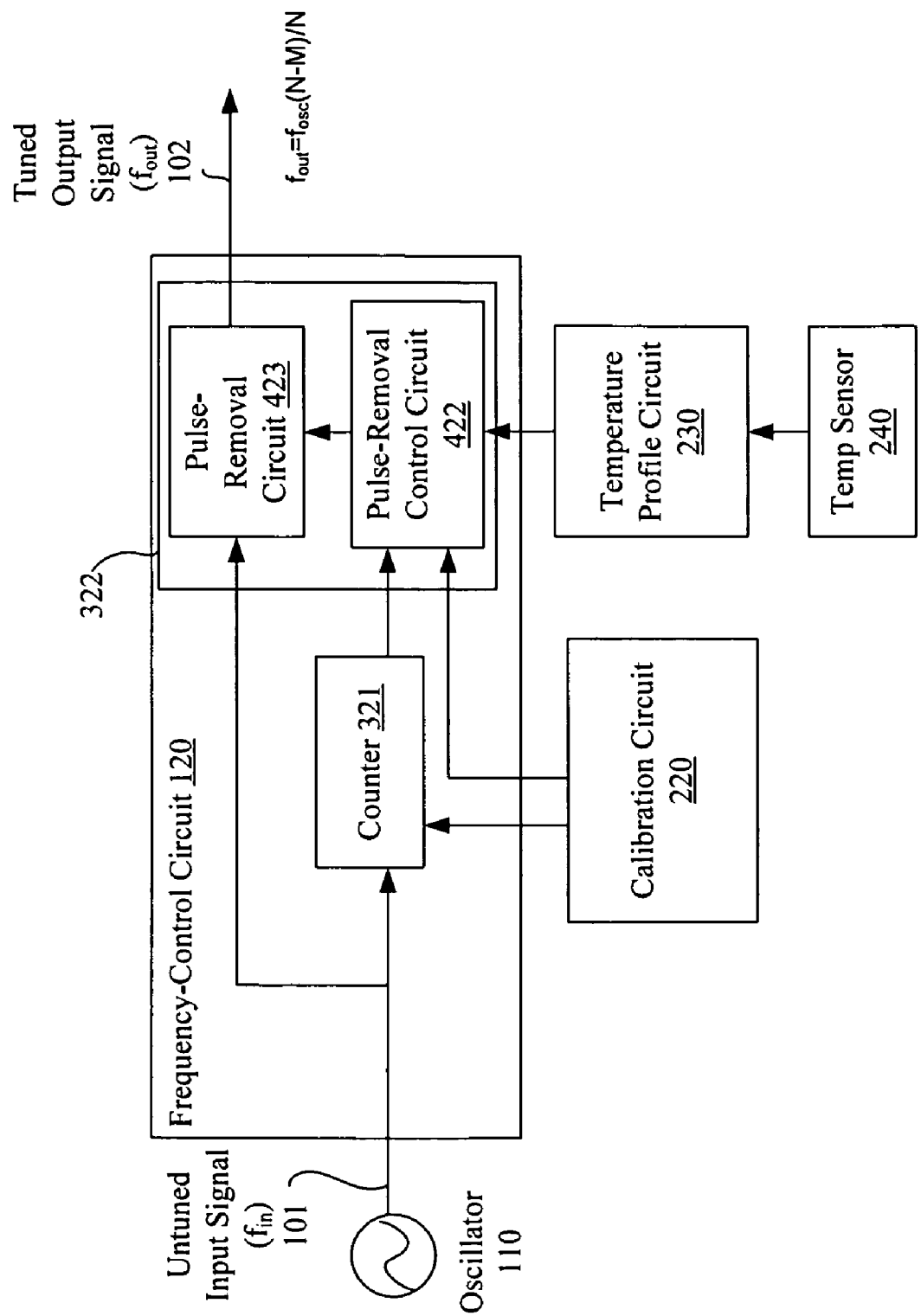
FIG. 4A is a block diagram of one embodiment of the pulse-altering circuit of FIG. 3 for pulse removal.

FIG. 4A is a block diagram of one embodiment of the pulse-altering circuit of FIG. 3 for pulse removal. The pulse-altering circuit 322 of FIG. 4A includes a pulse-removal control circuit 422 and a pulse-removal circuit 423. The pulse-removal control circuit 422 receives the count from the counter 321, the initial shift from the calibration circuit, and the temperature-compensated shift from the temperature profile circuit 230, if any, and determines the number of pulses that need to be removed over a period of time, as well as the timing of when those pulses are actually removed from the input signal 101. In one embodiment, the pulse-removal control circuit 422 compares the number of pulses against a threshold number of pulses, and provides a control signal based on the comparison. The pulse-removal circuit 423 receives the input signal 101 from the single oscillator 110 and the control signal from the pulse-removal control circuit 422 and removes a pulse from the input signal 101, upon receiving the control signal. The pulse-removal circuit 423 may remove one or more pulses of the input signal 101 when the control signal indicates that the number of pulses exceeds the threshold number of pulses. The pulse-removal circuit 423 may receive one or more control signals over the period of time to remove the necessary amount of pulses to tune the output frequency 102 to have an average frequency over time at the desired target frequency. Alternatively, the pulse-removal circuit 423 may receive one control signal that indicates the amount of pulses that need to be removed over a period of time to have an average frequency over time at the desired target frequency. In one embodiment, the pulse-removal control circuit 422 controls the timing of the pulse-removal circuit 423 to dither when the one or more pulses of the first signals are removed. In one embodiment, pulse removal may be done using clock gating, as described below. Alternatively, the pulse removal may be done using other techniques as would be appreciated by those of ordinary skill in the art.

As described above, the single oscillator 110 can be set to be a frequency ($f_{in}$) which is greater than the expected output frequency ($f_{out}$) (e.g., desired target frequency). It should also be noted that since the pulse removal technique for frequency calibration of MEMS is capable of only reducing the frequency, the pulse removal technique may have the following shortcomings: The MEMS have to be tuned to a higher frequency than expected, and any MEMS with a pre-calibration frequency below the final target frequency cannot be calibrated, which results in a lower yield. Also, since the mean value of the distribution of raw MEMS frequencies is higher than the target frequency, the simple calibration technique may result in a coarser post calibration frequency resolution. In order to overcome these shortcomings, in other embodiments, a pulse addition technique (e.g., FIG. 4B) or a combination of pulse removal and addition (e.g., FIG. 4C) may be used, as described below.

Figure 4B:
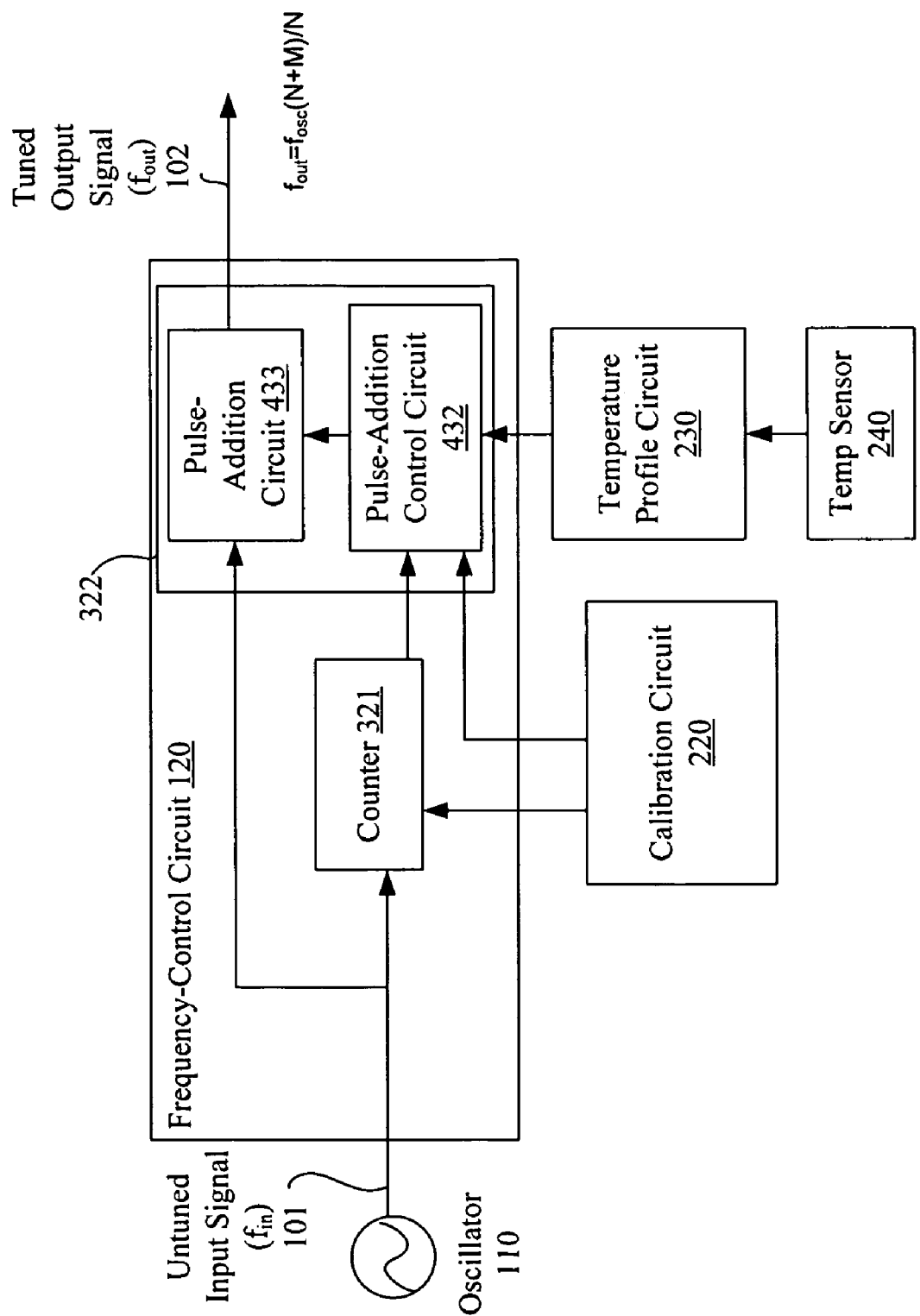
FIG. 4B is a block diagram of another embodiment of the pulse-altering circuit of FIG. 3 for pulse addition.

FIG. 4B is a block diagram of another embodiment of the pulse-altering circuit of FIG. 3 for pulse addition. The pulse-altering circuit 322 of FIG. 4B includes a pulse-addition control circuit 432 and a pulse-addition circuit 433. The pulse-addition control circuit 432 receives the count from the counter 321, the initial shift from the calibration circuit, and the temperature-compensated shift from the temperature profile circuit 230, if any, and determines the number of pulses that need to be added over a period of time, as well as the timing of when those pulses are actually added to the input signal 101. In one embodiment, pulse-addition control circuit 432 compares the number of pulses against a threshold number of pulses, and provides a control signal based on the comparison. The pulse-addition circuit 433 receives the input signal 101 from the single oscillator 110 and the control signal from the pulse-addition control circuit 432 and adds a pulse to the input signal 101, upon receiving the control signal. The pulse-addition circuit 433 may add one or more pulses of the input signal 101 when the control signal indicates that the number of pulses is less than the threshold number of pulses. The pulse-addition circuit 433 may receive one or more control signals over the period of time to add the necessary amount of pulses to tune the output frequency 102 to have an average frequency over time at the desired target frequency. Alternatively, the pulse-addition circuit 433 may receive one control signal that indicates the amount of pulses that need to be added over a period of time to have an average frequency over time at the desired target frequency. In one embodiment, the pulse-addition control circuit 432 controls the timing of the pulse-addition circuit 433 to dither when the one or more pulses of the first signals are added. In one embodiment, pulse addition technique may be done using a multiplexer and delay circuit, as described below. Alternatively, the pulse addition technique may be done using other techniques as would be appreciated by those of ordinary skill in the art.

Figure 4C:
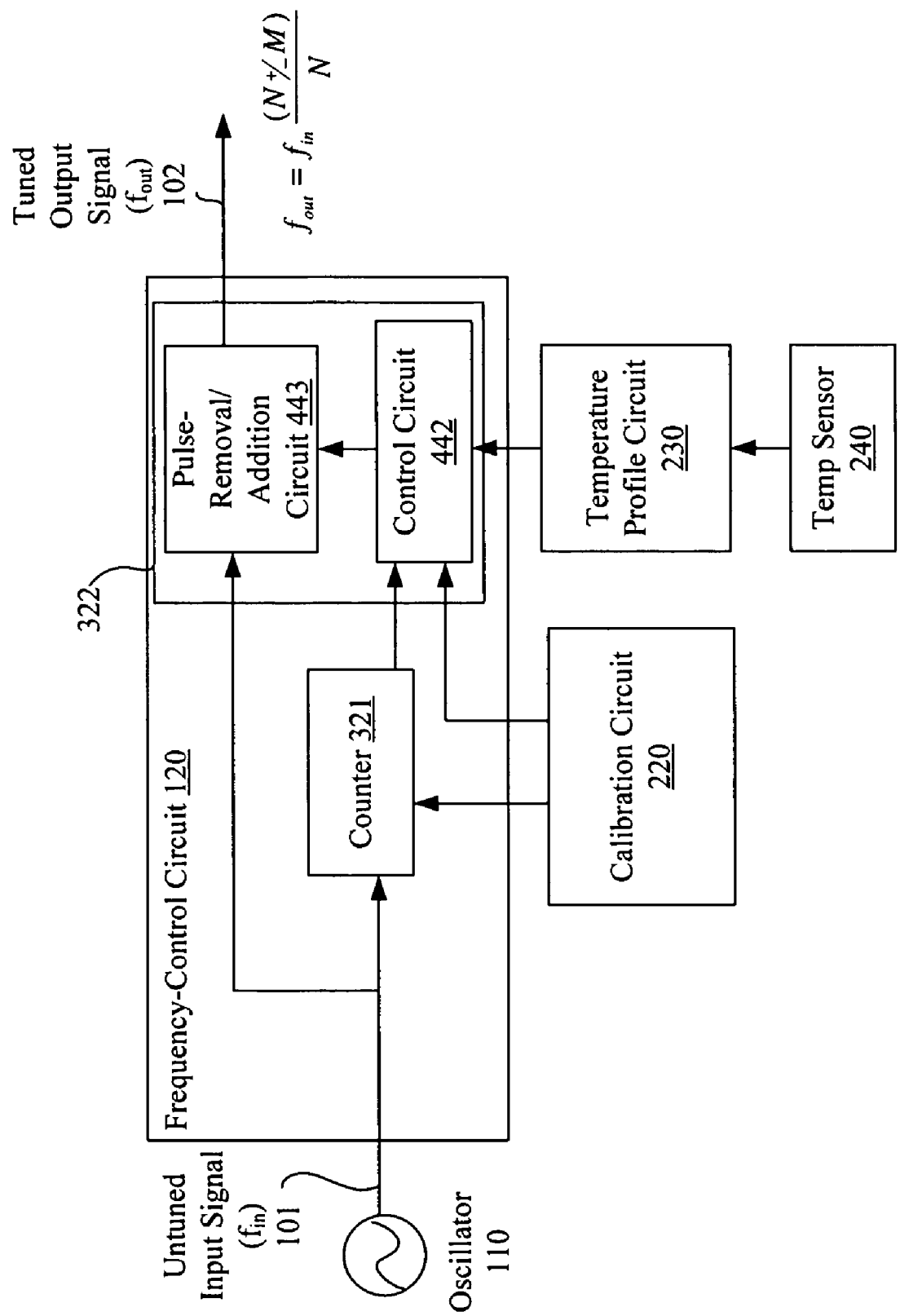
FIG. 4C is a block diagram of another embodiment of the pulse-altering circuit of FIG. 3 for pulse removal and addition.

FIG. 4C is a block diagram of another embodiment of the pulse-altering circuit of FIG. 3 for pulse removal and addition. The pulse-altering circuit 322 of FIG. 4C includes a control circuit 442 and a pulse-removal/addition circuit 443. The pulse-removal/addition control circuit 442 receives the count from the counter 321, the initial shift from the calibration circuit, and the temperature-compensated shift from the temperature profile circuit 230, if any, and determines the number of pulses that need to be removed or added over a period of time, as well as the timing of when those pulses are actually added to the input signal 101. In one embodiment, the control circuit 442 compares the number of pulses against a threshold number of pulses, and provides one of a first and second control signals. The control circuit 442 provides the first signal when the number of pulses exceeds the threshold number of pulses and provides the second signal when the number of pulses is less than the threshold number of pulses. In one embodiment, the first and second signals are separate signals. In another embodiment, the first and second signals are the same signal and indicate that the number of pulses is either greater than or less than the threshold number of pulses. In this embodiment, a single threshold value is used. In another embodiment, two threshold values may be used for the pulse removal and pulse addition.

The pulse-removal/addition circuit 443 receives the input signal 101 from the single oscillator 110 and the corresponding control signal from the control circuit 442 and adds or removes a pulse to the input signal 101, upon receiving the control signal. In one embodiment, the pulse-removal/addition circuit 443 includes a pulse-removal circuit and a pulse-addition circuit, as described above with respect to FIGS. 4A and 4B, respectively. The pulse-removal circuit receives the input signal 101 and the control signal, and removes one or more pulses from the input signal 101 when the control signal indicates that the number of pulses exceeds the threshold number of pulses. The pulse-addition circuit receives the input signal 101 and the control signal, and adds one or more pulses to the input signal 101 when the control signal indicates that the number of pulses is less than the threshold number of pulses. In this embodiment, one control signal is used. In another embodiment, two separate control signals may be used. For example, the pulse-removal/addition circuit 443 may add one or more pulses to the input signal 101 (e.g., using the pulse-addition circuit) when the first control signal is received, and may remove one or more pulses from the input signal 101 (e.g., using the pulse-removal circuit) when the second control signal is received, or vice versa. The pulse-removal/addition circuit 443 may receive one or more control signals over the period of time to remove or add the necessary amount of pulses to tune the output frequency 102 to have an average frequency over time at the desired target frequency. Alternatively, the pulse-removal/addition circuit 443 may receive one control signal that indicates the amount of pulses that need to be removed or added over a period of time to have an average frequency over time at the desired target frequency. In one embodiment, the control circuit 442 controls the timing of the pulse-removal/addition circuit 443 to dither when the one or more pulses of the first signals are removed or added. In one embodiment, pulse removal technique may be done using clock gating and the pulse addition technique may be done using a multiplexer and delay circuit, as described below. Alternatively, the pulse removal and pulse addition may be done using other techniques as would be appreciated by those of ordinary skill in the art. Although the pulse removing technique and the pulse addition technique may be employed in the pulse-removal/addition circuit 443, alternatively, in other embodiments, the pulse removing and pulse addition techniques may be implemented in separate circuit blocks, such as pulse-removal circuit 423 and pulse-addition circuit 433, controlled by a control circuit that includes the functionality described with respect to pulse-removal control circuit 422 and pulse-addition control circuit 432. Alternatively, other configurations are possible as would be appreciated by one of ordinary skill in the art.

It should be noted that the combination of pulse removal and addition may not change the resolution that can be attained in the system. For example, for a basic fixed-shift application (no dynamic shifting based on temperature), the circuit would be programmed to either remove a pulse or to add a pulse. In either case, an example shift of 1000 ppm gives a resolution of 1 ppm. One advantage of the combination of pulse removal and pulse addition may be that the initial frequency does not need to be purposefully offset, since the circuit can be programmed to either remove or add pulses to tune the initial frequency up or down. The worst case frequency shift required with the combined method is half of what it would be with deletion alone. The further advantage is that the resonators that are close to the desired frequency can actually be shifted with a much finer resolution. For example, if the one sigma parts (e.g., parts within the one standard deviation of the frequency distribution) are within 100 ppm of the desired frequency, these resonators can be shifted with a resolution of 0.01 ppm, whereas in the pulse-removal circuit, the resonators in the middle of the frequency distribution have less shifting resolution than the resonators at the low end of the curve. When temperature dependent frequency shifting is added, the combination of pulse removal and addition allows a wider range of temperature correction.

Figure 5A:
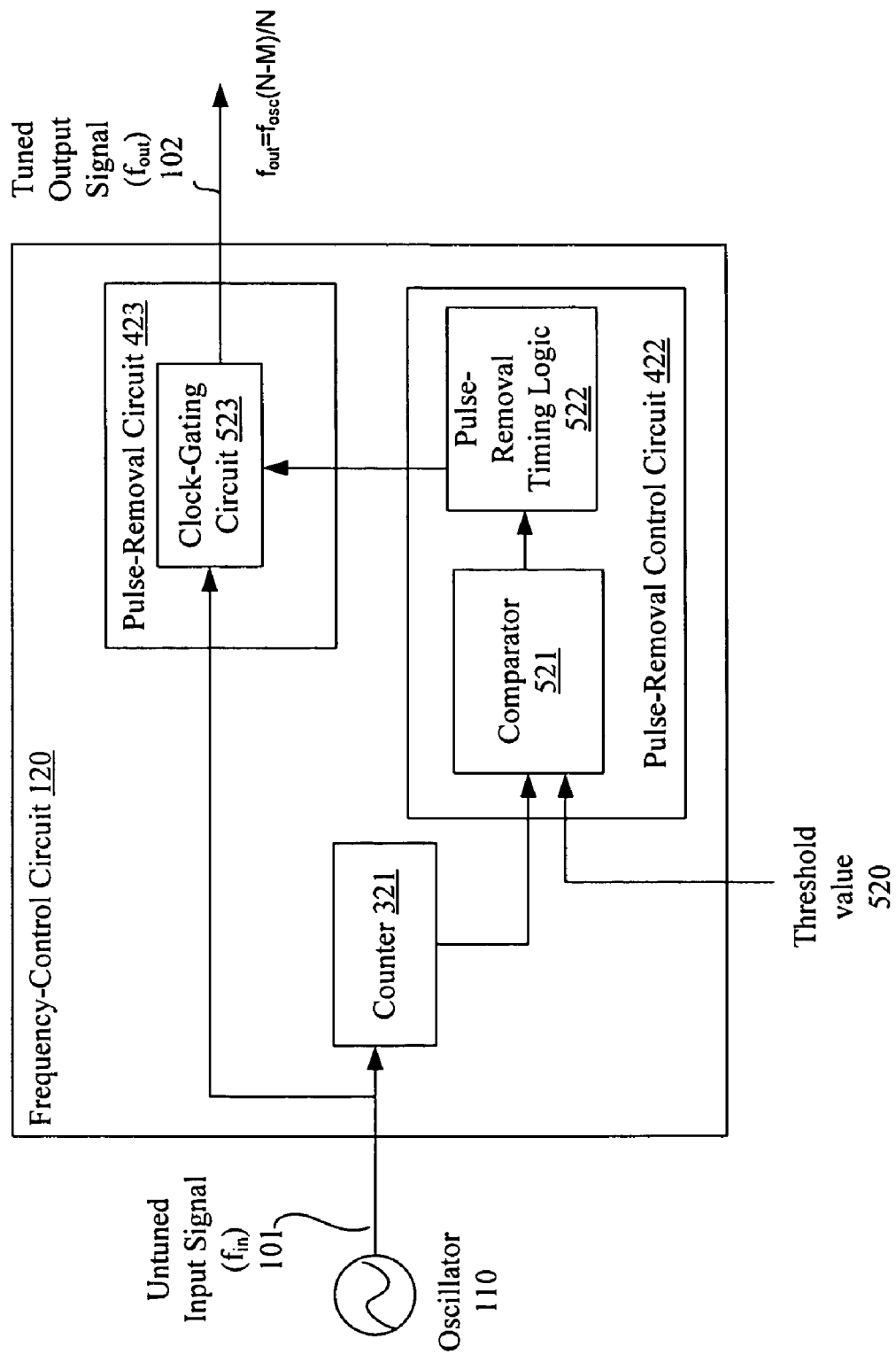
FIG. 5A is a block diagram of one embodiment of the pulse-removal circuit and pulse-removal control circuit of FIG. 4A.

FIG. 5A is a block diagram of one embodiment of the pulse-removal circuit and pulse-removal control circuit of FIG. 4A. The pulse-removal control circuit 422 of FIG. 5A includes a comparator 521 and pulse-removal timing logic 522. The comparator 521 is coupled to receive the count from the counter 321, as well as a threshold value 520. The threshold value 520 may be received from the temperature profile circuit 230, from the calibration circuit 220, or a combination thereof. For example, the threshold value 520 may be a pre-programmed value which is stored in the memory 250, which may be modified based on the temperature profile. Alternatively, the threshold value 250 may be determined by the temperature profile circuit 230 based on the measured temperature by the temperature sensor 240 and the temperature profile which is stored in the memory 250. In one embodiment, the threshold value 520 represents a count value that generates the temperature-compensated shift for the input signal 101 to tune the output signal 102 at the desired output frequency.

When the number of pulses counted by the counter 321 is equal to or greater than the threshold value 520, the comparator 521 may toggle a signal or raise a flag which is received by the pulse-removal timing logic 522. The pulse-removal timing logic 522 receives the toggled signal (or reads the raised flag) and determines the appropriate time to trigger the pulse-removal circuit 423. In one embodiment, once the number of pulses reaches the threshold value 520, the pulse-removal control circuit 422 removes any subsequent pulses in the given time period. In another embodiment, the pulse-removal control circuit 422 dithers the removal of pulses so that removed energy of the output signal 102 is spread out over the given period. For example, instead of removing the $1001^{th}$ pulse, the pulse-removal control circuit 422 may alternate between removing the $999^{th}$ pulse, the $1000^{th}$ pulse, the $1002^{nd}$ pulse, the $1003^{rd}$ pulse, or the like. By dithering which pulse is removed, the frequency of the pulse removal is spread.

In the depicted embodiment, when the pulse-removal timing logic 522 triggers a pulse to be removed, the next pulse of the input signal 101 is gated to remove the pulse. In particular, the pulse-removal circuit 423 includes a clock-gating circuit 523 (e.g., logic gate) that passes the pulses of the input signal through the clock-gating circuit 523, unless the clock-gating circuit 523 receives a signal from the pulse-removal timing logic 522. In one embodiment, the clock-gating circuit 523 is a NAND gate, which produces a value of false if and only if both of its operands are true, and produces a value of true if and only if at least one of its operands is false. Alternatively, those of ordinary skill in the art would appreciate that other types of logic may be used to gate the input signal 101 to remove one or more pulses.

In one embodiment, the output frequency ($f_{out}$) of the output signal 102 is expressed by the following equation (2):

$$f_{out} = f_{in} \frac{(N-M)}{N}, \qquad (2)$$

where N represents the count of pulses before pulses are removed and M represents the number of pulses to be removed. In other embodiments, the output frequency ($f_{out}$) of the output signal 102 can be computed using other techniques as would be appreciated by those of ordinary skill in the art. It should be noted that pulse-removal circuit 423 and the pulse-removal control circuit 422 may have more or less circuits than those described with respect to FIG. 5A. Also, it would be appreciated by one of ordinary skill in the art that other types of logic may be used to implement the pulse-removal functionality in other ways than the circuit described with respect to FIG. 5A.

The following embodiment is one way the average frequency can be increased with the pulse-altering circuit 322 by pulse adding. Once combined with the pulse-removal technique, the frequency can be calibrated up or down. Therefore, the oscillator can be tuned to the target frequency and can track temperature regardless of whether the initial frequency is too high or too low.

Figure 5B:
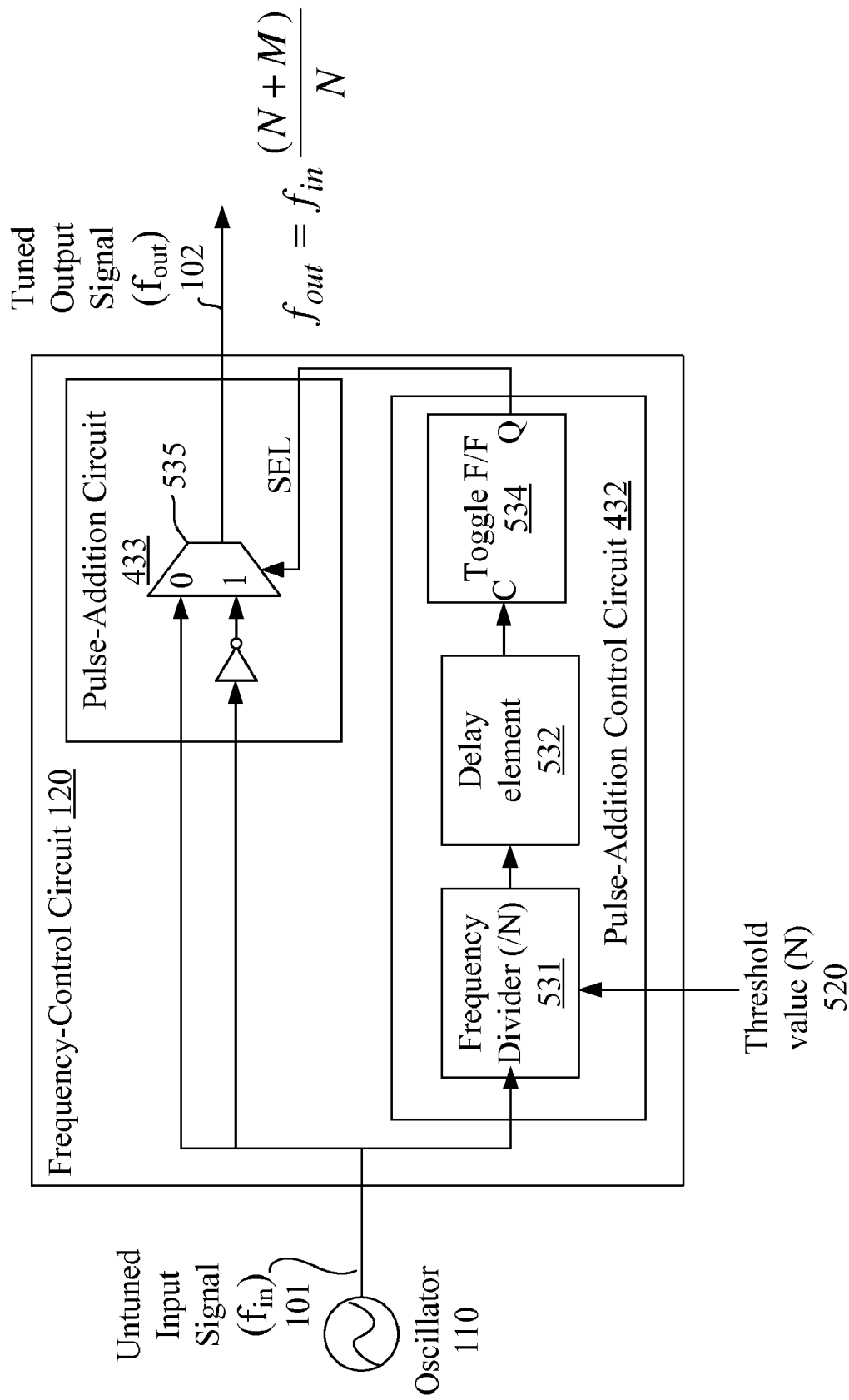
FIG. 5B is a block diagram of one embodiment of the pulse-addition circuit and pulse-addition control circuit of FIG. 4B.

FIG. 5B is a block diagram of one embodiment of the pulse-addition circuit and pulse-addition control circuit of FIG. 4B. The frequency-control circuit 120 of FIG. 5B includes the pulse-addition control circuit 432, and the pulse addition circuit 433. The frequency-control circuit 120 of FIG. 5B implements the pulse addition technique using the input clock (e.g., untuned input frequency ($f_{in}$) 101, its complement, a frequency divider 531, a delay element 532, a toggle flip-flop 534, and a multiplexer 535. The input clock is divided by N, threshold value 520, which represents the required shift (e.g., initial shift and/or the temperature-compensated shift) by the frequency divider 521, and input into an optional delay element 522. If the delay through the frequency divider 521 is sufficient to meet the requirements, the delay element 522 can be eliminated. Alternatively, other types of selection circuits than a multiplexer and other types of memory circuits than toggle flip-flops may be used.

Figure 5C:
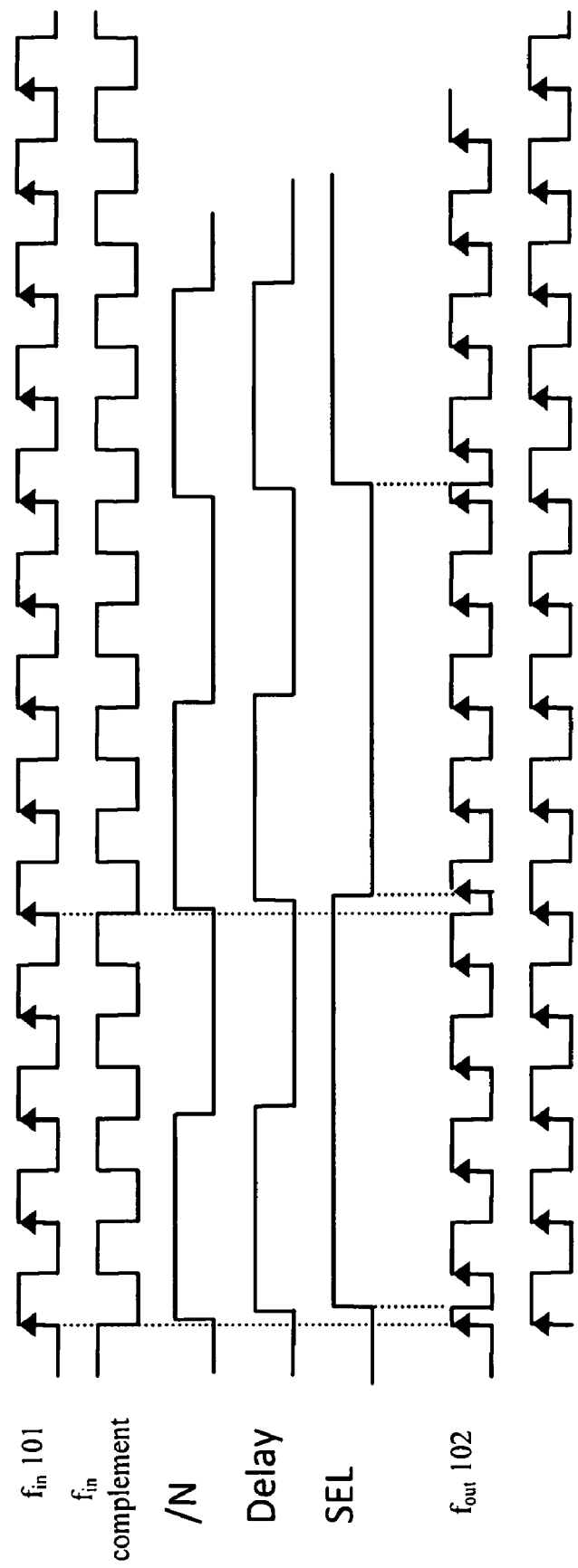
FIG. 5C is a timing diagram of one embodiment of the waveforms of the frequency-control circuit of FIG. 5B.

The following describes the operation of the frequency-control circuit 120 of FIG. 5B. Assuming that initially the multiplexer 535 is set to zero (e.g., SEL=0) to connect the input signal ($f_{in}$) 101 to the output signal ($f_{out}$) 102, on every rising edge of the input signal ($f_{in}$) 101, the count in the frequency divider circuit 531 increments. In one embodiment, the frequency divider 531 includes the counter 321 described with respect to FIG. 5A to count the number of pulses of the input signal ($f_{in}$) 101. After the Nth rising edge of the input signal ($f_{in}$) 101, the output signal ($f_{out}$) makes a low-to-high transition. The delay element 532 reproduces this transition at its output with a specified amount of propagation delay. The output of the delay element 532 clocks the toggle flip-flop 534, and consequently its output, the SEL signal, sets the multiplexer 535 to one (e.g., SEL=1). When the multiplexer is in the one state (e.g., SEL=1), the multiplexer 535 input switches to the complement of the input signal ($f_{in}$) 101, resulting in the next rising edge of the output signal ($f_{out}$) 102 being advanced by half of the period of output signal ($f_{out}$) 102. It is assumed that output signal ($f_{out}$) 102 has approximately 50% duty cycle. After another N cycles of the input signal ($f_{in}$) 101, the frequency divider 531 causes the toggle flip-flop 534 to toggle again, and the multiplexer 535 switches back to the input signal ($f_{in}$) 101, resulting in another half period of phase advance for the output signal ($f_{out}$) 102. Since the pulse-addition circuit 433 advances the phase by half of a clock period on the $N^{th}$ cycle of the input signal ($f_{in}$) 101, the average frequency of the output signal ($f_{out}$) 102 will be (1+1/(2N)) times the frequency of the input signal ($f_{in}$) 101. FIG. 5C is a timing diagram of one embodiment of the waveforms where the threshold value 520, N is equal to four (e.g., N=4).

In one embodiment, the output frequency ($f_{out}$) of the output signal 102 is expressed by the following equation (3):

$$f_{out} = f_{in}\frac{(N+M)}{N}, \qquad (3)$$

where N represents the count of pulses before pulses are added and M represents the number of pulses to be added. It should be noted that a simple logic change, as would be apparent to one of ordinary skill in the art, the circuit can be modified such that it inserts one extra pulse per correction and its operation becomes symmetrical to the pulse removal described above. The circuit can add or delete one full pulse per correction as described above with respect to FIG. 4C. In one embodiment, the output frequency ($f_{out}$) of the output signal 102 is expressed by the following equation (4):

$$f_{out} = f_{in}\frac{(N +/- M)}{N}, \qquad (4)$$

where N represents the count of pulses before pulses are removed or added and M represents the number of pulses to be removed or added.

The delay circuit combined with the propagation delays of frequency divider 531, the optional delay element 531, and the toggle flip-flop 534 define the pulse-width of the output signal ($f_{out}$) 102 at the time of toggling. This pulse width will have to meet the requirements for the circuits operating from output signal ($f_{out}$) 102. It should be noted that pulse-addition circuit 433 and the pulse-addition control circuit 432 may have more or less circuits than those described with respect to FIG. 5B. Also, it would be appreciated by one of ordinary skill in the art that other types of logic may be used to implement the pulse-addition functionality in other ways than the circuit described with respect to FIG. 5B.

Although the embodiments described above with respect to FIGS. 3-5B use a single oscillator 110, in other embodiments, more than one oscillator may be used to generate an output signal having an average frequency over time at the desired target frequency to provide an accurate, temperature stable clock source, as described below with respect to FIGS. 6-8.

Figure 6:
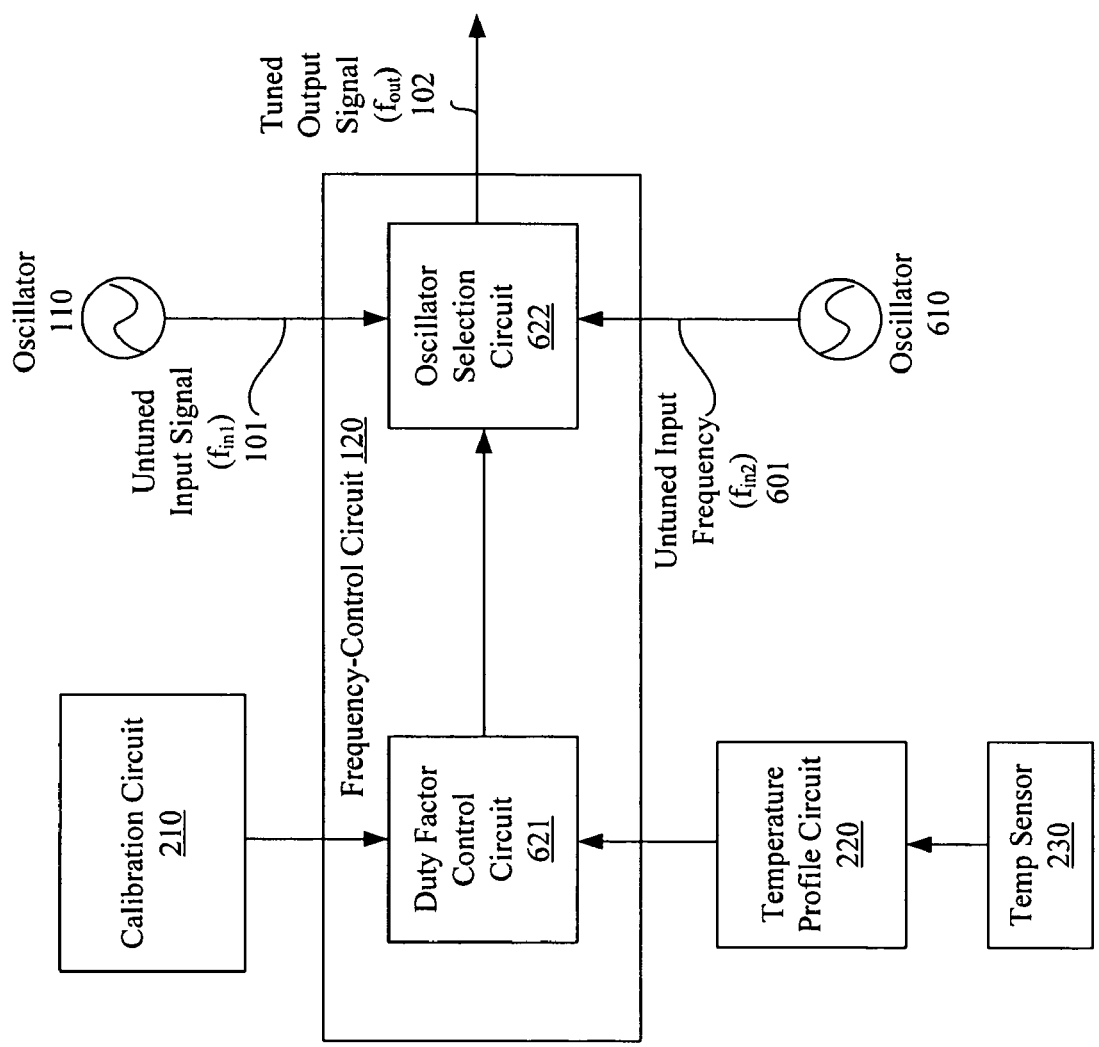
FIG. 6 is a block diagram of one embodiment of the frequency-control circuit having a duty-factor control circuit and an oscillator selection circuit to alter one or more pulses of two untuned input signals to generate a tuned output signal.

FIG. 6 is a block diagram of one embodiment of the frequency-control circuit 120 having a duty-factor control circuit 621 and an oscillator selection circuit 622 to alter one or more pulses of two untuned input signals 101 and 601 to generate a tuned output signal 102. The frequency-control circuit 120 of FIG. 6 can adjust the output frequency of the output signal 102 (e.g., clock output frequency) by altering certain pulses to shift the average frequency to be at the desired target frequency. Averaged over enough cycles, the adjusted frequency can be very accurate (e.g., 1 ppm or better). The duty factor control circuit 621 is coupled to receive the initial frequency shift from the calibration circuit 210, and the temperature-compensated shift from the temperature profile circuit 220. Alternatively, the duty factor control circuit 621 is coupled to receive the total required shift that includes both the initial shift and the temperature-compensated shift.

The oscillator selection circuit 622 is coupled to receive signals 101 and 601 from two oscillators 110 and 610, respectively, which are intentionally set to different frequencies ($f_{in1}$ and $f_{in2}$). In one embodiment, the first input frequency (GO of the oscillator 110 is set to be intentionally below the desired target frequency while the second input frequency ($f_{in2}$) of the oscillator 610 is set to be intentionally above the desired target frequency. For example, in one embodiment in which the desired target frequency is 125 MHz, the first input frequency is 120 MHz and the second untuned frequency is 130 MHz. Alternatively, other frequencies and differences between the first and second frequencies may be used, such as desired target frequencies between approximately 32 kHz to hundreds of megahertz. In another embodiment, the first input frequency ($f_{in1}$) of the oscillator 110 is set to be intentionally above the desired target frequency while the second input frequency ($f_{in2}$) of the oscillator 610 is set to be intentionally below the desired target frequency. The oscillator selection circuit 622 is configured to switch periodically, under control of the duty factor control circuit 621, between the first and second input signals 101 and 601, at a duty factor which is dependent on the initial calibration and/or temperature compensation. By adjusting the duty factor, the pulses of the first and second input signals 101 and 601 are altered so that the average frequency of the output frequency is to set the desired target frequency. The duty factor may be dithered to reduce discrete spurious signal tones associated with switching between the two frequencies. In one embodiment, the oscillator selection circuit 622 is a two input switch that toggles between the two input signals having two untuned frequencies to generate the output signal 102 having a tuned frequency which is between the two frequencies. Alternatively, the oscillator selection circuit 622 may be other types of circuits, as would be appreciated by those of ordinary skill in the art, to switch between the two signals to effectively generate an average frequency over a period of time, such as a multiplexer or a transmission gate.

Figure 7:
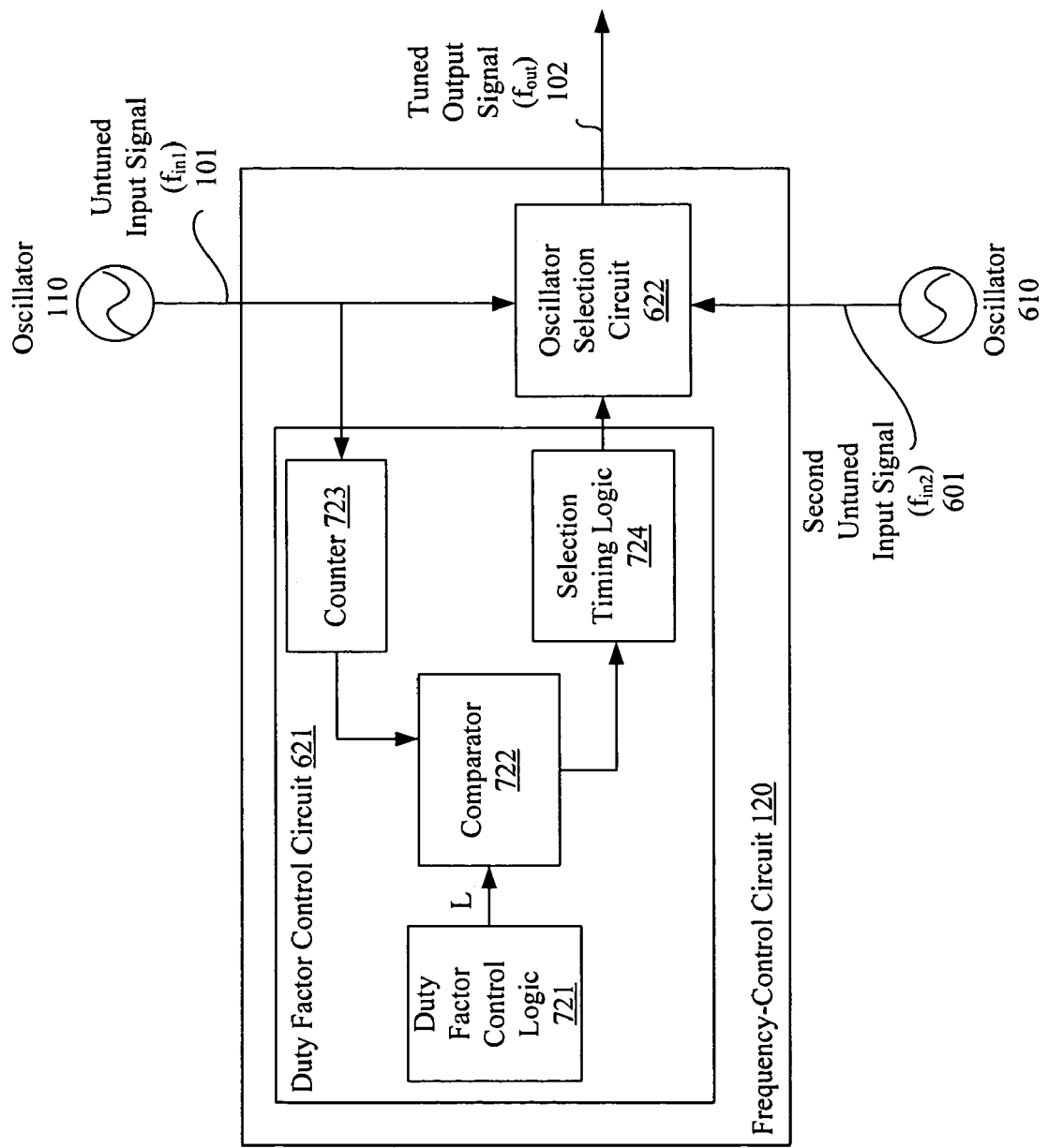
FIG. 7 is a block diagram of one embodiment of the duty factor control circuit of FIG. 6.

FIG. 7 is a block diagram of one embodiment of the duty factor control circuit 621 of FIG. 6. The duty factor control circuit 621 of FIG. 4A includes the duty factor control logic 721, a comparator 722, a counter 723, and selection timing logic 724. The duty factor control logic 721 receives the initial frequency shift from the calibration circuit 210, and the temperature-compensated shift from the temperature profile circuit 220 (not illustrated). Alternatively, the duty factor control circuit 621 is coupled to receive the total required shift that includes both the initial shift and the temperature-compensated shift. The duty factor control logic 721 sends a threshold value (e.g., L) to the comparator 722. The comparator 722 receives the threshold value and a count value from the counter 723. The counter 723 counts the number of pulses of the first input signal 102, which has been set to have a frequency which is higher than the desired target frequency. Alternatively, the counter 723 may be configured to count the number of pulses of the second input signal 601. Similarly, the duty factor control circuit 621 can be configured to count the number of pulses of the frequency which is lower than the desired target frequency and control the selection of the first and second input signals 101 and 601.

When the number of counts, received from the counter 723, is equal to or greater than the threshold value, received from the duty factor control logic 721, the comparator 722 may toggle a signal or raise a flag which is received by the selection timing logic 724. The selection timing logic 724 receives the toggled signal (or reads the raised flag) and determines the appropriate time to switch from the first input signal 101 to the second input signal 601, and sends a control signal to the oscillator selection circuit 622 to switch from the first input signal 101 to the second input signal 601. Alternatively, the selection timing logic 724 may switch from the second input signal 601 to the first input signal 101. The selection timing logic 724 may be used to provide glitch-less switching between the two signals 101 and 601. For example, in one embodiment, a simple switch could be used that receives the toggle signal from the comparator 722, and merely switches between the two signals 101 and 601. Without the selection timing logic 724, the resulting output signal may have one large pulse (e.g., one pulse from the first signal and one pulse from the second signal) if the signals are switched at a certain time, or the resulting output signal may have one large non-pulse (e.g., between pulses in the first signal and between pulses of the second signal). Using the selection timing logic 724, the oscillator selection circuit 622 can be a glitch-less switch, which provides a transition between the two signals without any glitches.

In one embodiment, the desired target frequency ($f_{ave}$) is 125 MHz, the first input frequency ($f_{in1}$) is 120 MHz, and the second input frequency ($f_{in2}$) is 130 MHz. Assuming there is no correction made for glitch-less switching, the frequency-control circuit 120 starts outputting the first signal 101 for a first period of time ($T_1$). Nominally, the frequency-control circuit 120 counts 5000 pulses, using the counter 723, and then switches to output the second signal 601 for a second period of time ($T_2$) using the oscillator selection circuit 622. The frequency-control circuit 120 counts another 5000 pulses, using the counter 723, and then switches back to the first input signal 101. As a result of the switching between the first untuned frequency (GO and the second untuned frequency ($f_{in2}$), the resulting output frequency ($f_{ave}$) has the desired target frequency ($f_{ave}$) of 125 MHz over a given period of time, T (T=$T_1$+$T_2$). In this embodiment, the count threshold is set to be 5000. However, by increasing the count threshold to be 5001, the frequency-control circuit 120 counts 5001 pulses of the first signal 101, using the counter 723, and switches to the second input signal 601, using the oscillator selection circuit 622. The frequency-control circuit 120 counts 4999 pulses of the second signal 601, using the counter 723, and switches back to the first input signal 101, using the oscillator selection circuit 622. By increasing the count threshold by 1 count, the output frequency shifts down by approximately 8 ppm. The amount that the output frequency shifts due to one count is considered to be the tuning resolution of the frequency-control circuit 120. In this embodiment, the tuning resolution is 8 ppm, assuming a total cycle count of 10,000 pulses is used. The total time for one cycle in this embodiment is 80 microseconds. In other embodiments, the total cycle count may be other values ranging between 10 to millions. Also, other total cycle counts, tuning resolutions, and total cycle times may be used based on the specifications of a particular application.

It should be noted that at any given point in time in the cycle, the instantaneous frequency of the output signal 102 will be either 120 MHz ($f_{in1}$) or 130 MHz ($f_{in2}$), depending on the point of time in the cycle, the frequency is measured. However, the output frequency of the output signal 102 has an average output frequency ($f_{ave}$) over a period of time (e.g., one cycle). In switching between the two frequencies that are above and below the desired target frequency, the output frequency is averaged out over time to set the output frequency at the desired target frequency. As such, using the output frequency in an application does not require instantaneous frequency accuracy, the output frequency would be an accurate average time over the cycle. For example, the frequency-control circuit 120 may start counting at the first pulse and use the total number of pulses to determine some set duration of time. However, it should be noted that there may be some error if the clock is not checked at the end of a cycle. The worst case scenario would be if the time is sampled right after the output switches from the first oscillator 110 to the second oscillator 610. In the nominal case, the frequency-control circuit 120 that counts 5000 pulses at 120 MHz, then 5000 pulses at 130 MHz, in order to have a maximum error which is no more than 10 ppm, the time should be sampled after 2000 full cycles (e.g., 20 million pulses). This would give an averaging time of approximately 0.16 seconds for 10 ppm error. Alternatively, other averaging times and maximum errors may be used based on the particular design.

Figure 8:
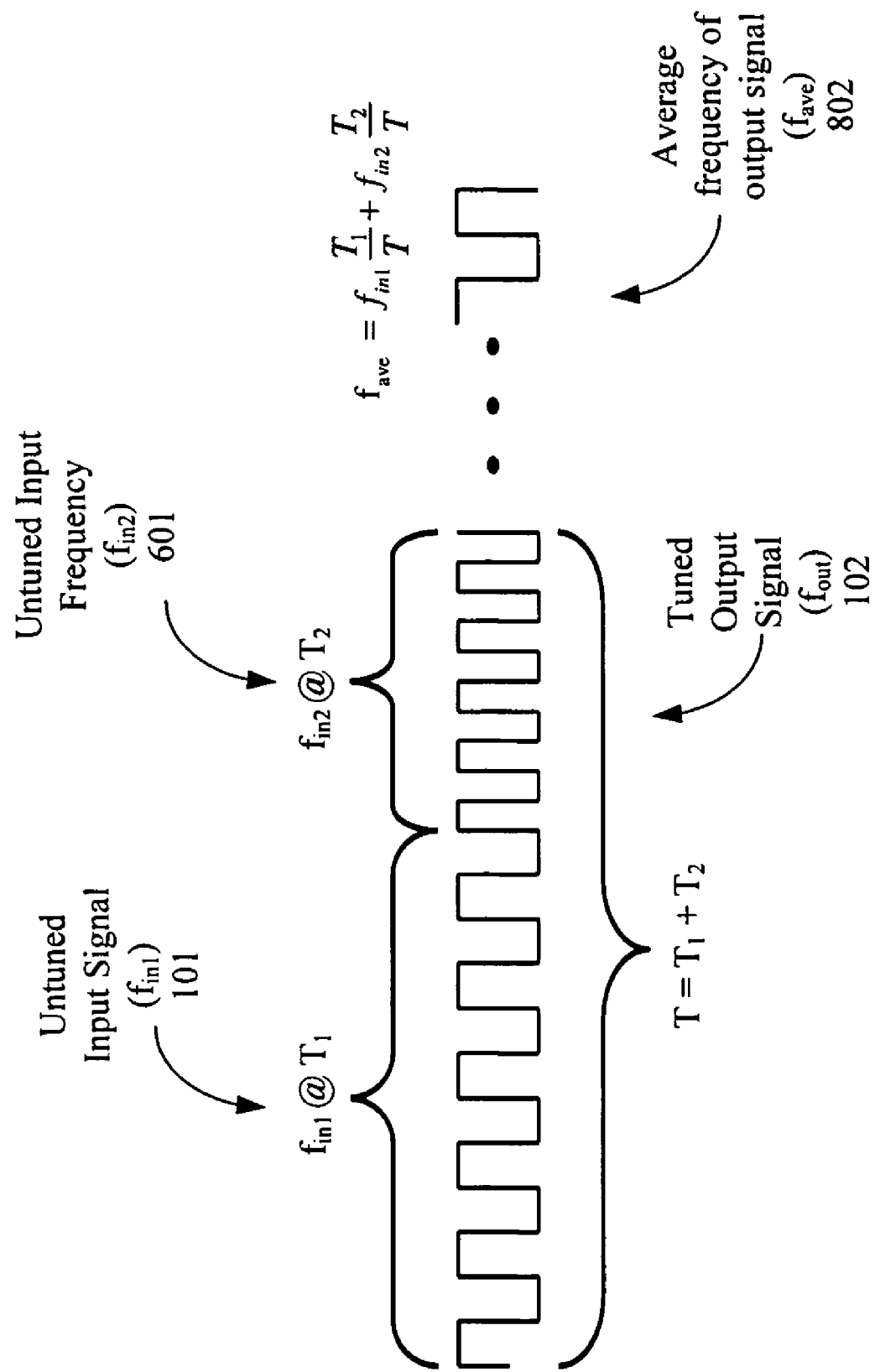
FIG. 8 is a timing diagram of one embodiment of the output signal of the frequency-control circuit using the embodiment of FIG. 7.

FIG. 8 is a timing diagram of one embodiment of the output signal 102 of the frequency-control circuit using the embodiment of FIG. 7. As described above, the frequency ($f_{out}$) of the output signal 102 is switched between the first untuned frequency (GO of the first input signal 101, and the second untuned frequency ($f_{in2}$) of the second input signal 601. In particular, the oscillator selection circuit 622 selects the first input signal 101 for a first period of time ($T_1$), and the second input signal 601 for a second period of time ($T_2$). Although the instantaneous frequency of the output signal 102 is either the first untuned frequency (GO or the second untuned frequency ($f_{in2}$), the average frequency ($f_{ave}$) over a period of time (T), including the first and second time periods (T=$T_1$+ $T_2$) is averaged to be an average frequency ($f_{ave}$) 802 which is between the first untuned frequency (GO and the second untuned frequency ($f_{in2}$), as expressed in the following equation (5):

$$f_{ave} = f_{in1}\frac{T_1}{T} + f_{in2}\frac{T_2}{T} \qquad (5)$$

The desired target frequency can be set by switching between the first untuned frequency (GO and the second untuned frequency ($f_{in2}$) at a duty factor to result in the average frequency ($f_{ave}$) 802 of the output signal 102 being at the desired target frequency. Although in this depicted embodiment, the first and second frequencies are switched one time during the period, in other embodiments, the switching may occur at one or more times during the period. Also, in other embodiments, the frequency switching can be dithered to reduce spurious signals in the output signal 102 and improve the tuning resolution of the output signal 102, as described herein.

Figure 9:
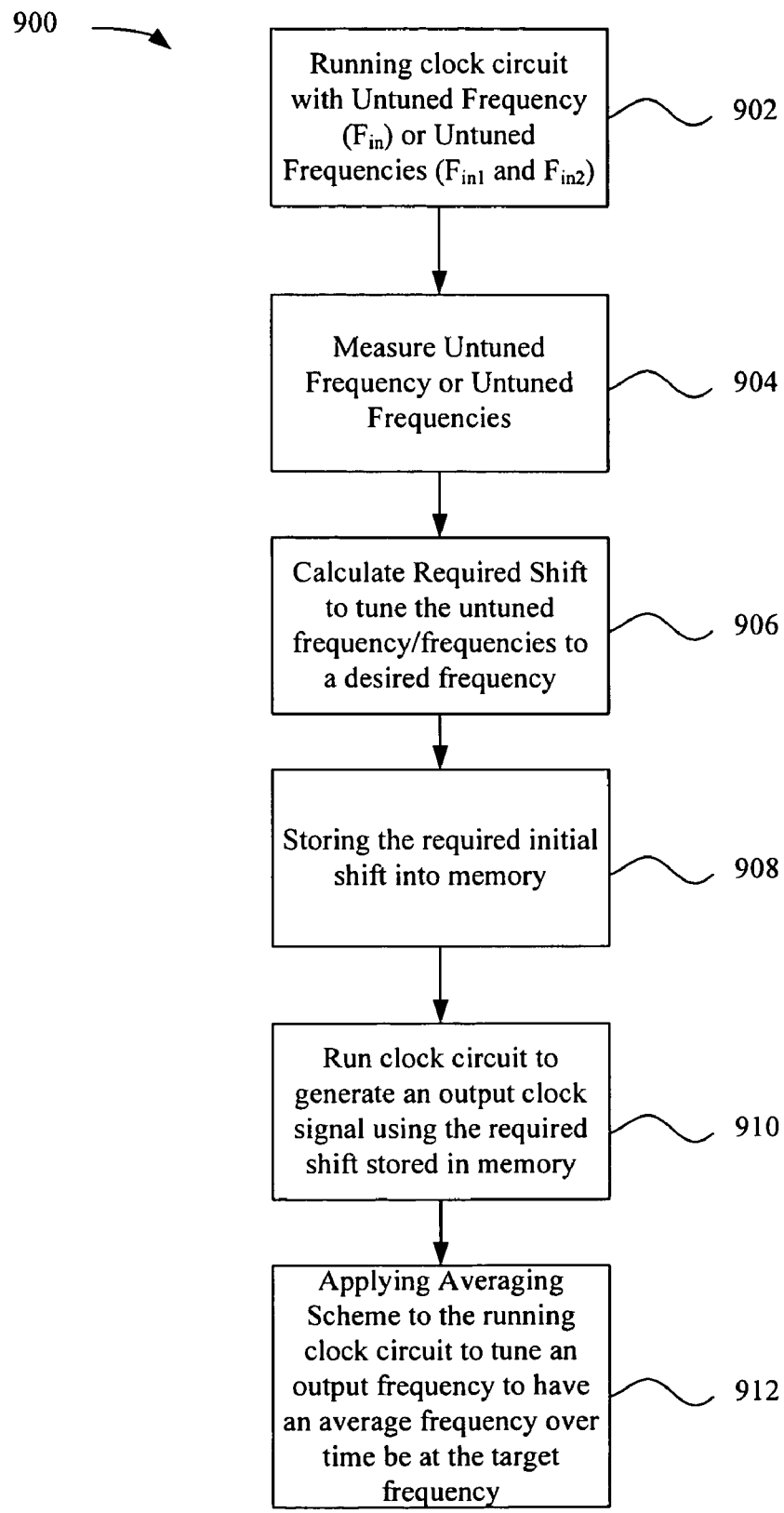
FIG. 9 is a flow diagram of one embodiment of a method for applying an averaging scheme to a running clock circuit to tune an output frequency to have an initial frequency at the desired target frequency.

FIG. 9 is a flow diagram of one embodiment of a method 900 for applying an averaging scheme to a running clock circuit to tune an output frequency to have an initial frequency at the desired target frequency. The method 900 begins by running the clock circuit with either a single untuned frequency ($f_{in}$) or the two untuned frequencies ($F_{in1}$ and $F_{in2}$) (block 902). Next, the single untuned frequency ($f_{in}$) or the two untuned frequencies ($F_{in1}$ and $F_{in2}$) are measured (block 904). The method 900 then calculates the required initial shift(s) to tune the single untuned frequency ($f_{in}$) or the two untuned frequencies ($F_{in1}$ and $F_{in2}$) to a desired target frequency (block 906). The required initial shift is then stored into memory (e.g., memory 250 of FIG. 2) to be used by the frequency-control circuit 120 during operation of the clock circuit (block 908). In one embodiment, the required initial shift is programmed into memory one time as an initial calibration of the clock circuit, such as an EPROM. Alternatively, the required initial shift can be stored into other types of memories as would be appreciated by those of ordinary skill in the art, such as a memory that allows the initial calibration value to be recalibrated. In another embodiment, the single untuned frequency ($f_{in}$) or the two untuned frequencies ($F_{in1}$ and $F_{in2}$) and the desired target frequency are stored into memory (e.g., memory 250 of FIG. 2). In this embodiment, logic in the frequency-control circuit 120 may be used to calculate the threshold number of pulses (e.g., required shift) while the circuit is running.

Once the required initial shift is stored in memory, the clock circuit is run to generate an output clock signal using the required initial shift stored in memory (block 910). As part of running the clock circuit, an averaging scheme is applied to the running clock circuit (block 912). The averaging scheme is applied to the running clock circuit to tune the output frequency of the output clock signal to be at a desired target frequency by altering the pulses of one or more pulses of the single untuned frequency ($f_{in}$) or the two untuned frequencies ($F_{in1}$ and $F_{in2}$) so that the average frequency of the output frequency is set at the desired target frequency. In one embodiment, the averaging scheme uses a single-oscillator averaging scheme, as described with respect of FIG. 11. The single-oscillator averaging scheme may use pulse removal or addition to tune the output frequency of the output clock signal to have the average frequency over time at the desired target frequency. Alternatively, the single-oscillator averaging scheme may use pulse removal and addition to tune the output frequency of the output clock signal to have the average frequency over time at the desired target frequency. In another embodiment, the averaging scheme uses a dual-oscillator averaging scheme, as described with respect of FIG. 12.

Figure 10:
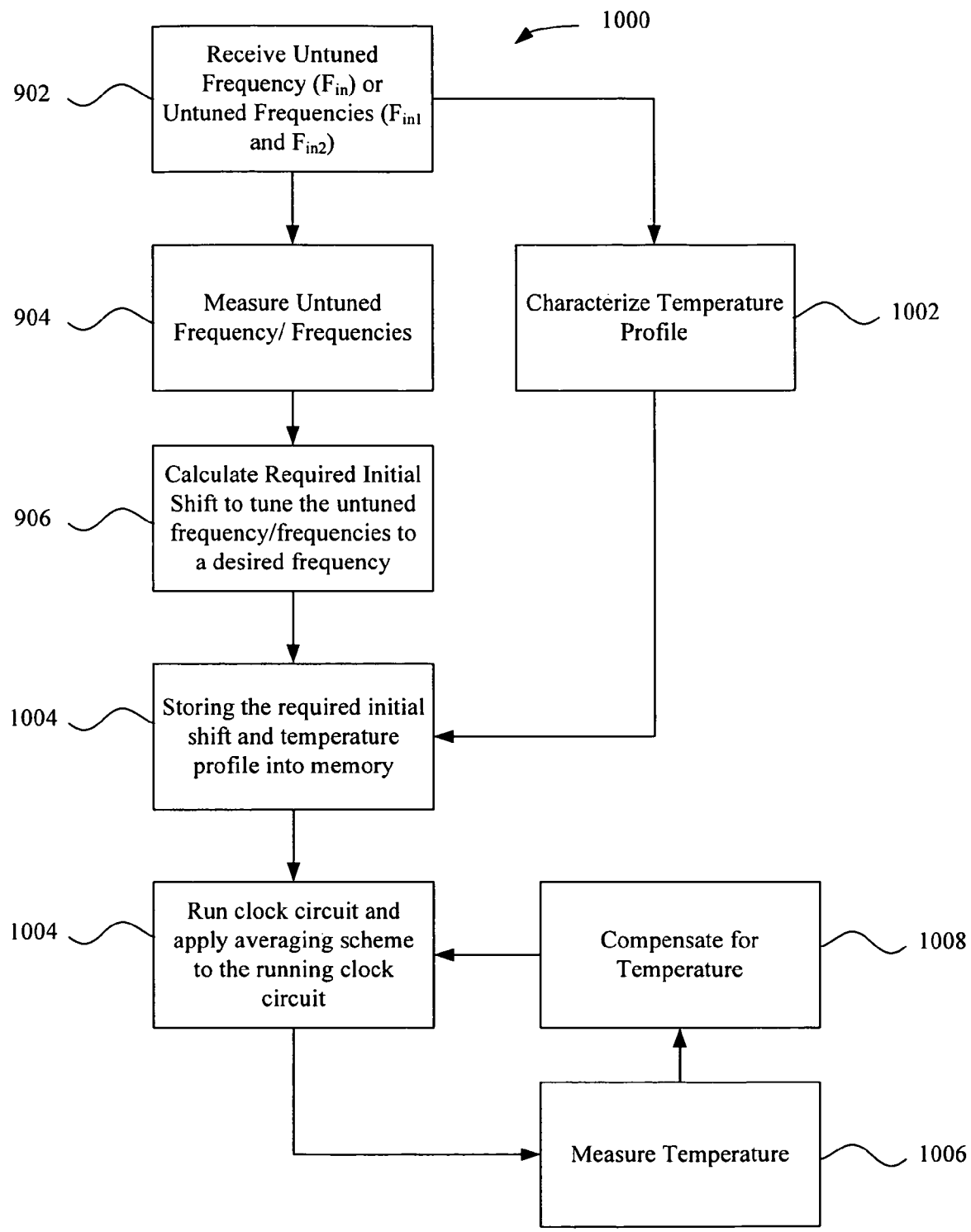
FIG. 10 is a flow diagram of one embodiment of a method for applying the averaging scheme to a running clock circuit to tune an output frequency to have an initial frequency and to tune the output frequency to compensate for temperature.

FIG. 10 is a flow diagram of one embodiment of a method for applying the averaging scheme to a running clock circuit to tune an output frequency to have an initial frequency and to tune the output frequency to compensate for temperature. The method 1000 is used to tune an output frequency to have an average frequency over time at the desired target frequency over a given temperature range. The method 1000 includes similar operations as described in the method 900, as indicated by similar reference labels, except the method 1000 compensates for temperature, by first characterizing the temperature profile of the clock circuit (block 1002). As described above, the temperature profile is indicative of the temperature characteristics (e.g., temperature coefficient) of the clock circuit, and may indicate the amount of change in frequency per degree change in temperature and may be representative of a graph of the resonance frequency of each of the oscillators over a range of temperatures. It should be noted that the temperature profile may not necessarily be characterized for each manufactured circuit, but perhaps, may be done for one of many manufactured circuits that have the same or similar design.

In addition, instead of just storing the required initial shift into memory (e.g., memory 250) as done in the method 900, the method 1000 also stores the temperature profile into memory (block 1004). The stored temperature profile may be used to compensate for temperature when running the circuit. Once the required initial shift and the temperature profile are stored in memory, the clock circuit is run to generate an output clock signal using the required initial shift and the required temperature-compensated shift, if any, which are stored in memory. As part of running the clock circuit, an averaging scheme is applied to the running clock circuit (block 1004). The averaging scheme is applied to the running clock circuit to tune the output frequency of the output clock signal to be at a desired target frequency by altering the pulses of one or more pulses of the single untuned frequency ($f_{in}$) or the two untuned frequencies ($F_{in1}$ and $F_{in2}$) so that the average frequency of the output frequency is set at the desired target frequency, regardless of the temperature. The averaging scheme is used to tune an output frequency to have an average frequency over time at the desired target frequency over a given temperature range using the stored temperature profile.

In order to compensate for temperature, the method 1000 measures the temperature (block 1006), and compensates for the measured temperature (block 1008) continuously by shifting the output frequency to the desired target frequency, regardless of the temperature, using the temperature-compensated shift. The averaging scheme determines the required temperature-compensated shift based on the measured temperature and alters one or more pulses of the input signal(s) to shift the output frequency to the desired target frequency. As such, the method 1000 provides an accurate clock signal having an average frequency over time at the desired target frequency. In one embodiment, the averaging scheme uses a single-oscillator averaging scheme, as described with respect of FIG. 11. In another embodiment, the averaging scheme uses a dual-oscillator averaging scheme, as described with respect of FIG. 12.

Figure 11:
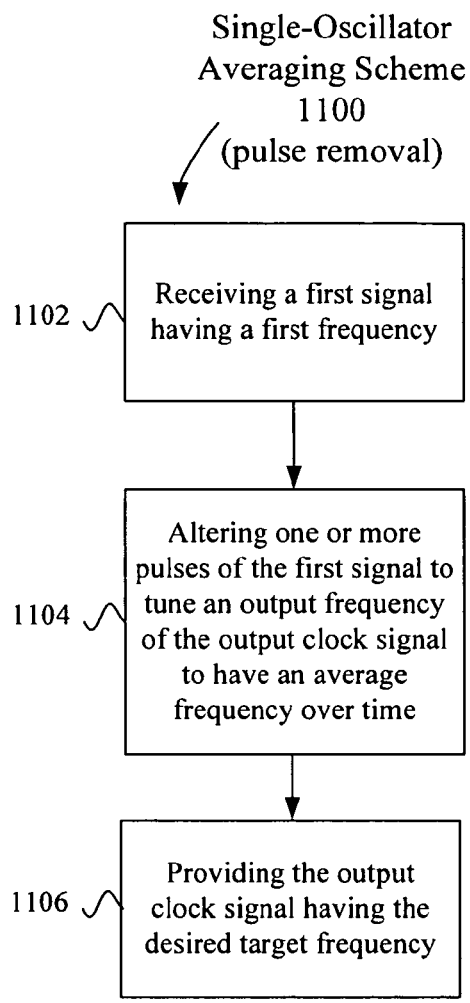
FIG. 11 is a flow diagram of one embodiment of a method for a single-oscillator averaging scheme.

FIG. 11 is a flow diagram of one embodiment of a method 1100 for a single-oscillator averaging scheme. The method 1100 begins by receiving a first signal having a first untuned frequency (block 1102). The single-oscillator averaging scheme alters one or more pulses of the first signal to tune an output frequency of an output clock signal to have an average frequency over time at a desired target frequency (block 1104). The averaging scheme then provides the output clock signal having the desired target frequency (block 1106). In one embodiment, the output clock signal is used in a sleep clock application. In other embodiments, the output clock signal is used in other applications where instantaneous frequency accuracy is not required.

In one embodiment, the one or more pulses of the first signal are altered by removing one or more pulses from the first signal to tune the output frequency of the output clock signal to have the average frequency over time at the desired target frequency. In one embodiment, the altering operation (block 1104) includes counting a number of pulses of the first signal, comparing the number of pulses against a threshold value, and removing a pulse when the number of pulses exceeds the threshold value. In another embodiment, after a first pulse has been removed, an additional pulse may be removed at another point in the cycle so that the removal of the additional pulse is dithered with the removal of the first pulse. When shifting the output frequency to another frequency, the threshold value may be modified to a modified threshold value. The number of pulses are counted and compared against the modified threshold value. Based on the comparison, one or more pulses may be altered to tune the output frequency of the output signal to have the average frequency at the desired target frequency at the measured temperature. Alternatively, the one or more pulses of the first signal may be modified in other ways than pulse removal, such as pulse addition or pulse removal and addition as described herein.

In one embodiment, the method 1100 also tunes the output frequency of the output signal to an initial frequency based on an initial value (e.g., required initial shift) stored in memory, such as described with respect to FIG. 9. In another embodiment, the method also tunes the output frequency based on the initial value and the temperature profile stored in memory, such as described with respect to FIG. 10. In particular, a current temperature (e.g., absolute temperature or relative temperature) is measured and the temperature-compensated shift is determined using the temperature profile, and the method tunes the output frequency based on the required initial shift and temperature-compensated shift.

Figure 12:
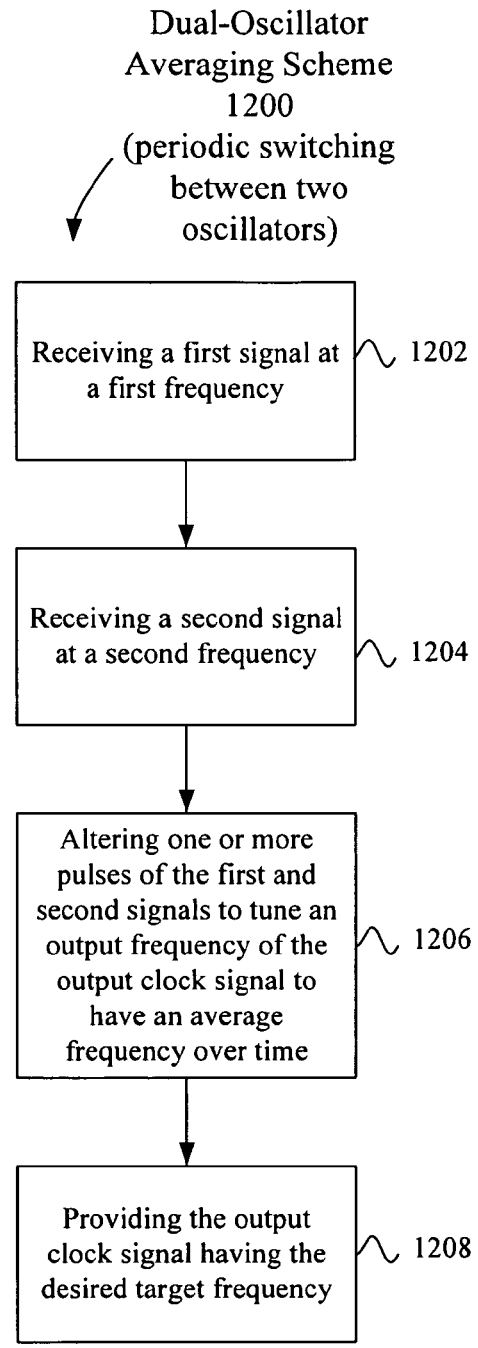
FIG. 12 is a flow diagram of one embodiment of a method for a dual-oscillator averaging scheme.

FIG. 12 is a flow diagram of one embodiment of a method 1200 for a dual-oscillator averaging scheme. The method 1200 begins by receiving a first signal at a first untuned frequency (block 1202), and receiving a second signal having a second untuned frequency (block 1204). The dual-oscillator averaging scheme alters one or more pulses of the first signal and the second signal to tune an output frequency of an output clock signal to have an average frequency over time at a desired target frequency (block 1206). The averaging scheme then provides the output clock signal having the desired target frequency (block 1208). In one embodiment, the output clock signal is used in a sleep clock application. In other embodiments, the output clock signal is used in other applications where instantaneous frequency accuracy is not required.

In one embodiment, the altering operation (block 1206) includes periodically switching between the first and second signals at a duty factor to tune the output frequency of the output clock signal to have the average frequency over time at the desired target frequency. When shifting the output frequency to another frequency, the duty factor may be modified to a new duty factor. The modified duty factor is used to switch between the first and second signal at the modified duty factor to shift the output frequency to the desired target frequency. Alternatively, the one or more pulses of the first and second signals may be altered in other ways.

In one embodiment, the method 1200 also tunes the output frequency of the output signal to an initial frequency based on an initial value (e.g., required initial shift) stored in memory, such as described with respect to FIG. 9. In another embodiment, the method also tunes the output frequency based on the initial value and the temperature profile stored in memory, such as described with respect to FIG. 10. In particular, a current temperature (e.g., absolute temperature or relative temperature) is measured and the temperature-compensated shift is determined using the temperature profile, and the method tunes the output frequency based on the required initial shift and temperature-compensated shift.

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. An apparatus, comprising:
a first oscillator to provide a first signal having a first untuned frequency, wherein the first oscillator is a Microelectromechanical systems (MEMS) oscillator; and
a frequency-control circuit coupled to receive the first signal and to provide an output clock signal having an output frequency, wherein the frequency-control circuit is configured to alter one or more pulses of the first signal to tune the output frequency of the output clock signal to have an average frequency over time at a desired target frequency, and wherein the frequency-control circuit comprises: a counter to count a number of pulses of the first signal, and a pulse-altering circuit coupled to receive the number of pulses from the counter and to alter the one or more pulses of the first signal to tune the output frequency based on the received number of pulses;
wherein the pulse-altering circuit comprises a pulse-removal control circuit to receive the number of pulses from the counter, to compare the number of pulses against a threshold number of pulses, and to provide a control signal based on the comparison;
wherein the pulse-altering circuit also comprises a pulse-removal circuit to receive the first signal and the control signal and to remove one or more pulses from the first signal when the control signal indicates that the number of pulses exceeds the threshold number of pulses, wherein the pulse-removal circuit provides the output clock signal having the average frequency; and
wherein the pulse-removal control circuit is configured to control the timing of the pulse-removal circuit to dither when the one or more pulses of the first signal are removed.

2. An apparatus, comprising:
a first oscillator to provide a first signal having a first untuned frequency, wherein the first oscillator is a Microelectromechanical systems (MEMS) oscillator; and
a frequency-control circuit coupled to receive the first signal and to provide an output clock signal having an output frequency, wherein the frequency-control circuit is configured to alter one or more pulses of the first signal to tune the output frequency of the output clock signal to have an average frequency over time at a desired target frequency, and wherein the frequency-control circuit comprises: a counter to count a number of pulses of the first signal, and a pulse-altering circuit coupled to receive the number of pulses from the counter and to alter the one or more pulses of the first signal to tune the output frequency based on the received number of pulses;
wherein the pulse-altering circuit comprises a pulse-addition control circuit to receive the number of pulses from the counter, to compare the number of pulses against a threshold number of pulses, and to provide a control signal based on the comparison;
wherein the pulse-altering circuit also comprises a pulse-addition circuit to receive the first signal and the control signal and to add one or more pulses to the first signal when the control signal indicates that the number of pulses is less than the threshold number of pulses, wherein the pulse-addition circuit provides the output clock signal having the average frequency; and wherein the pulse-addition control circuit is configured to control the timing of the pulse-addition circuit to dither when the one or more pulses of the first signal are added.

3. An apparatus, comprising:
a first oscillator to provide a first signal having a first untuned frequency; and
a frequency-control circuit coupled to receive the first signal and to provide an output clock signal having an output frequency, wherein the frequency-control circuit is configured to alter one or more pulses of the first signal to tune the output frequency of the output clock signal to have an average frequency over time at a desired target frequency, wherein the frequency-control circuit comprises:
a counter to count a number of pulses of the first signal;
a control circuit to receive the number of pulses from the counter, to compare the number of pulses against a threshold number of pulses, and to provide a control signal based on the comparison;
a pulse-removal circuit to receive the first signal and the control signal and to remove one or more pulses from the first signal when the control signal indicates that the number of pulses exceeds the threshold number of pulses; and
a pulse-addition circuit to receive the first signal and the control signal and to add one or more pulses to the first signal when the control signal indicates that the number of pulses is less than the threshold number of pulses.

4. The apparatus of claim 3, wherein the pulse-removal circuit is a clock-gating circuit that gates the received first signal when the number of pulses exceeds the threshold number of pulses, and wherein the output of the clock gating circuit is the output clock signal.

5. The apparatus of claim 3, further comprising a memory to store the value representative of the threshold number of pulses to tune the output clock signal to the average frequency, wherein the pulse-addition control circuit receives the threshold number of pulses from the memory to compare against the number of pulses.

6. The apparatus of claim 3, further comprising a memory to store the value representative of the threshold number of pulses to tune the output clock signal to the average frequency, wherein the control circuit receives the threshold number of pulses from the memory to compare against the number of pulses.

7. The apparatus of claim 3, wherein the control circuit is configured to control the timing of the pulse-addition and pulse-removal circuits to dither when the one or more pulses of the first signal are added or removed.

8. The apparatus of claim 3, wherein the frequency-control circuit is configured to receive a measured temperature from a temperature sensor and to alter the one or more pulses of the first signal based on the measured temperature to tune the output frequency of the output clock signal to have the average frequency over time at the desired target frequency over a range of temperatures.

9. The apparatus of claim 3, further comprising a memory coupled to the frequency-control circuit, wherein the memory is configured to store an initial value for tuning the output frequency to an initial frequency for calibration.

10. The apparatus of claim 9, wherein the memory is configured to store a temperature profile of the apparatus.

11. The apparatus of claim 3, further comprising a register coupled to the frequency-control circuit, wherein the register is configured to store an initial value for tuning the output frequency to an initial frequency for calibration.

12. An apparatus, comprising:
a first oscillator to provide a first signal having a first untuned frequency; and
a frequency-control circuit coupled to receive the first signal and to provide an output clock signal having an output frequency, wherein the frequency-control circuit is configured to alter one or more pulses of the first signal to tune the output frequency of the output clock signal to have an average frequency over time at a desired target frequency, wherein the frequency-control circuit comprises
a pulse-altering control circuit comprising:
a frequency divider; and
a flip-flop coupled to the frequency divider; and
a pulse-altering circuit coupled to the pulse-altering control circuit, wherein the pulse-altering circuit comprises a selection circuit controlled by the output of the flip flop.

13. The apparatus of claim 12, wherein the pulse altering control circuit further comprises a delay element coupled to the frequency divider and the flip-flop.

14. The apparatus of claim 12, wherein the first oscillator is a Microelectromechanical systems (MEMS) oscillator.

15. The apparatus of claim 12, wherein the first oscillator is a crystal oscillator.

16. The apparatus of claim 12, wherein the first oscillator is an inductance-capacitance oscillator.

17. The apparatus of claim 12, wherein the first oscillator is a resistance-capacitance oscillator.

18. The apparatus of claim 12, wherein the pulse-altering circuit is configured to remove the one or more pulses from the first signal to tune the output frequency of the output clock signal to have the average frequency over time at the desired target frequency.

19. The apparatus of claim 12, wherein the pulse-altering circuit is configured to add the one or more pulses to the first signal to tune the output frequency of the output clock signal to have the average frequency over time at the desired target frequency.

20. The apparatus of claim 12, wherein the pulse-altering circuit is configured to remove a pulse from the first signal and to add a pulse to the first signal to tune the output frequency of the output clock signal to have the average frequency over time at the desired target frequency.

21. An apparatus, comprising:
a first oscillator to provide a first signal having a first untuned frequency; and
a frequency-control circuit coupled to receive the first signal and to provide an output clock signal having an output frequency, wherein the frequency-control circuit is configured to alter one or more pulses of the first signal to tune the output frequency of the output clock signal to have an average frequency over time at a desired target frequency, wherein the frequency-control circuit comprises:
a control circuit to compare a number of pulse of the first signal against a threshold number of pulses; and
a circuit coupled to the control circuit to remove one or more pulses from the first signal and to add one or more pulses to the first signal, wherein the control circuit is configured to control the circuit to remove one or more pulses from the first signal when the number of pulses exceeds the threshold number of pulses and to add one or more pulses to the first signal when the number of pulses is less than the threshold number of pulses.

22. An apparatus, comprising:
a first oscillator to provide a first signal having a first untuned frequency; and
a frequency-control circuit coupled to receive the first signal and to provide an output clock signal having an output frequency, wherein the frequency-control circuit is configured to alter one or more pulses of the first signal to tune the output frequency of the output clock signal to have an average frequency over time at a desired target frequency;
a memory to store a temperature profile of the apparatus;
a temperature sensor to measure a temperature of the apparatus; and
a temperature profile circuit configured to receive the temperature from the temperature sensor and the temperature profile from the memory, and to provide a control signal to the frequency-control circuit to tune the output frequency of the output clock signal to have the average frequency over a range of temperatures using the measured temperature and the temperature profile, wherein the frequency-control circuit uses the control signal to modify a threshold number of pulses which is compared against a counted number of pulses of the first signal to tune the output frequency of the output signal to have the average frequency over the range of temperatures.

23. A method, comprising:
receiving a first signal having a first untuned frequency; and
altering one or more pulses of the first signal to tune an output frequency of an output clock signal to have an average frequency over time at a desired target frequency, wherein said altering comprises:
dividing the first signal by N using a frequency divider, wherein N represents a required shift by the frequency divider; and
switching between the first signal and its compliment after N number of first edges of the first signal, wherein the first edge is either a rising edge or a falling edge, and wherein each switch between the first signal and its compliment advances a next first edge by half a period of the output clock signal.

24. The method of claim 23, further comprising tuning the output frequency of the output clock signal to an initial frequency based on an initial value stored in a memory, wherein the initial value is represented by N.

25. The method of claim 23, wherein said altering comprises:
counting a number of pulses of the first signal;
comparing the number of pulses of the first signal against a threshold value, wherein the threshold value is represented by N; and
removing a pulse from the first signal when the number of pulses of the first signal exceeds the threshold value.

26. The method of claim 25, further comprising removing an additional pulse when the number of pulses exceeds the threshold value, wherein the removing the additional pulse is dithered from the removal of the pulse.

27. The method of claim 23, wherein said altering comprises:
counting a number of pulses of the first signal;
comparing the number of pulses of the first signal against a threshold value, wherein the threshold value is represented by N; and
adding a pulse to the first signal when the number of pulses of the first signal is less than the threshold value.

28. The method of claim 23, wherein said altering comprises:
adding a first pulse to the first signal; and
removing a second pulse from the first signal.

29. The method of claim 23, further comprising measuring a temperature, and wherein said altering one or more pulses of the first signal comprises altering the one or more pulses of the first signal to tune the output frequency of the output clock signal to have the average frequency over time at the desired target frequency at the measured temperature.

30. A method, comprising:
receiving a first signal having a first untuned frequency; and
altering one or more pulses of the first signal to tune an output frequency of an output clock signal to have an average frequency over time at a desired target frequency; and
measuring a temperature, wherein said altering the one or more pulses of the first signal comprises:
modifying a threshold value to a modified threshold value using a temperature profile stored in memory and the measured temperature;
counting a number of pulses of the first signal;
comparing the number of pulses of the first signal against the modified threshold value; and
altering the one or more pulses, based on the comparison, to tune the output frequency of the output signal to have the average frequency at the desired target frequency over a range of temperatures.

31. A method, comprising:
receiving a first untuned frequency signal at a clock circuit;
measuring a first untuned frequency of the first untuned frequency signal;
calculating a required shift to tune the first untuned frequency to a desired tuned frequency;
running the clock circuit to generate an output clock signal using the required shift; and
applying a single-oscillator averaging scheme to the running clock circuit to tune an output frequency of the output clock signal to have an average frequency over time at the desired target frequency, wherein the single-oscillator averaging scheme uses at least pulse addition to tune the output frequency of the output clock signal to have the average frequency over time at the desired target frequency.

32. The method of claim 31, further comprising:
characterizing a temperature profile of an oscillator providing the first untuned frequency signal, wherein the temperature profile is representative of the resonance frequency of the oscillator over a range of temperatures;
storing the temperature profile into a memory;
measuring a current temperature; and
compensating the running clock circuit to tune the output frequency to have the average frequency over a range of temperatures based on the current temperature and temperature profile.

33. The method of claim 31, wherein the single-oscillator averaging scheme uses pulse removal and the pulse addition to tune the output frequency of the output clock signal to have the average frequency over time at the desired target frequency.

34. A method, comprising:
receiving a first untuned frequency signal at a clock circuit;
measuring a first untuned frequency of the first untuned frequency signal;

calculating a required shift to tune the first untuned frequency to a desired tuned frequency;
running the clock circuit to generate an output clock signal using the required shift; and
applying a single-oscillator averaging scheme to the running clock circuit to tune an output frequency of the output clock signal to have an average frequency over time at the desired target frequency, wherein the single-oscillator averaging scheme uses pulse removal to tune the output frequency of the output clock signal to have the average frequency over time at the desired target frequency.

* * * * *